United States Patent
Oh et al.

(10) Patent No.: US 8,987,100 B2
(45) Date of Patent: Mar. 24, 2015

(54) METHOD OF FABRICATING FIN-FIELD EFFECT TRANSISTORS (FINFETS) HAVING DIFFERENT FIN WIDTHS

(71) Applicant: Samsung Electronics Co., Ltd., Suwon-si, Gyeonggi-do (KR)

(72) Inventors: Chang Woo Oh, Suwon-si (KR); Shincheol Min, Seoul (KR); Jongwook Lee, Yongin-si (KR); Choongho Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/780,527

(22) Filed: Feb. 28, 2013

(65) Prior Publication Data

US 2013/0244392 A1    Sep. 19, 2013

(30) Foreign Application Priority Data

Mar. 19, 2012 (KR) .................. 10-2012-0027735

(51) Int. Cl.
| | | |
|---|---|---|
| H01L 21/336 | (2006.01) | |
| H01L 29/66 | (2006.01) | |
| H01L 21/02 | (2006.01) | |
| H01L 21/302 | (2006.01) | |
| H01L 21/308 | (2006.01) | |
| H01L 21/8238 | (2006.01) | |
| H01L 27/092 | (2006.01) | |

(52) U.S. Cl.
CPC .... H01L 29/66477 (2013.01); H01L 21/02107 (2013.01); H01L 21/302 (2013.01); H01L 21/3086 (2013.01); H01L 21/823821 (2013.01); H01L 29/66818 (2013.01); H01L 27/0924 (2013.01)
USPC ........... 438/299; 438/197; 438/400; 438/696; 257/E21.002; 257/E21.19; 257/E29.255

(58) Field of Classification Search
None
See application file for complete search history.

(56) References Cited

U.S. PATENT DOCUMENTS

| | | | |
|---|---|---|---|
| 6,909,147 B2 | 6/2005 | Aller et al. | |
| 7,224,029 B2 | 5/2007 | Anderson et al. | |
| 7,612,405 B2 | 11/2009 | Yu et al. | |
| 7,960,287 B2 | 6/2011 | Johnson et al. | |
| 7,994,583 B2 | 8/2011 | Inaba | |
| 2011/0143528 A1* | 6/2011 | Juengling | 438/589 |
| 2013/0001591 A1* | 1/2013 | Wu et al. | 257/77 |
| 2013/0059401 A1* | 3/2013 | Sudo | 438/3 |

* cited by examiner

*Primary Examiner* — Charles Garber
*Assistant Examiner* — Abdulfattah Mustapha
(74) *Attorney, Agent, or Firm* — Myers Bigel Sibley & Sajovec, PA

(57) ABSTRACT

Provided are methods of forming field effect transistors. The method includes preparing a substrate with a first region and a second region, forming fin portions on the first and second regions, each of the fin portions protruding from the substrate and having a first width, forming a first mask pattern to expose the fin portions on the first region and cover the fin portions on the second region, and changing widths of the fin portions provided on the first region.

19 Claims, 29 Drawing Sheets

METHOD OF FABRICATING FIN-FIELD EFFECT TRANSISTORS (FINFETS) HAVING DIFFERENT FIN WIDTHS

CROSS-REFERENCE TO RELATED APPLICATIONS

This U.S. non-provisional patent application claims priority under 35 U.S.C. §119 to Korean Patent Application No. 10-2012-0027735, filed on Mar. 19, 2012, in the Korean Intellectual Property Office, the entire contents of which are hereby incorporated by reference.

BACKGROUND

Embodiments of the inventive concepts relate to field effect transistors, and in particular, to methods of fabricating fin field effect transistors.

Due to their small-size, multi-functionality, and/or low-cost characteristics, semiconductor devices are considered important elements in the electronic industry. The semiconductor devices can be generally classified into memory devices for storing data, logic devices for processing data, and hybrid devices including both of memory and logic elements. Increased demand for electronic devices with faster speed and/or lower power consumption may require semiconductor devices having faster operating speed and/or lower operating voltage. To satisfy these requirements, the semiconductor devices may include components with more complex structures and/or increased integration density.

SUMMARY

Embodiments of the inventive concepts provide methods of fabricating field effect transistors. According to these methods, some of the field effect transistors are formed to include fin portions having different widths from each other.

According to some example embodiments of the inventive concepts, a method of fabricating an integrated circuit device includes forming fin-shaped transistor channel regions protruding from first and second regions of a substrate, and selectively altering respective widths of ones of the fin-shaped transistor channel regions protruding from the first region while maintaining respective widths of ones of the fin-shaped transistor channel regions protruding from the second region.

In some embodiments, selectively altering may include one of etching or growing a semiconductor layer on sidewalls of the ones of the fin-shaped transistor channel regions protruding from the first region.

In some embodiments, the respective widths of the ones of the fin-shaped transistor channel regions protruding from the first and second regions may be substantially similar prior to selectively altering the respective widths of the ones of the fin-shaped transistor channel regions protruding from the first region.

In some embodiments, after selectively altering the respective widths of the ones of the fin-shaped transistor channel regions protruding from the first region, respective heights of the ones of the fin-shaped transistor channel regions protruding from the first and second regions of the substrate may be substantially similar In some embodiments, after selectively altering the respective widths of the ones of the fin-shaped transistor channel regions protruding from the first region, surfaces of the first and second regions may be non-coplanar.

In some embodiments, the substrate may be doped prior to selectively altering the respective widths of the ones of the first fin-shaped transistor channel regions. After selectively altering the respective widths of the ones of the fin-shaped transistor channel regions protruding from the first region, the ones of the fin-shaped transistor channel regions protruding from the first region may have different doping concentrations or doping amounts than the ones of the fin-shaped transistor channel regions protruding from the second region.

According to further example embodiments of the inventive concepts, a method of forming field effect transistors may include preparing a substrate with a first region and a second region, forming fin portions on the first and second regions, each of the fin portions protruding from the substrate and having a first width, forming a first mask pattern to expose the fin portions on the first region and cover the fin portions on the second region, and changing widths of the fin portions provided on the first region.

In example embodiments, the changing of the widths of the fin portions may include growing a semiconductor layer on the fin portions.

In example embodiments, the method may further include forming device isolation layers on lower sidewalls of the fin portions. The semiconductor layer may be formed before the forming of the device isolation layers.

In example embodiments, the forming of the fin portions may include forming second mask patterns on the substrate, and etching the substrate using the second mask patterns as an etch mask. The semiconductor layer may be formed on sidewalls of the fin portions and a top surface of the substrate exposed by the first and second mask patterns, In example embodiments, the method may further include forming device isolation layers on lower sidewalls of the fin portions. The first mask pattern and the semiconductor layer may be formed after the forming of the device isolation layers.

In example embodiments, the semiconductor layer may be formed on upper sidewalls and top surfaces of the fin portions exposed by the device isolation layers and the first mask pattern.

In example embodiments, the semiconductor layer may be formed of a material having different lattice constant and/or bandgap from the fin portions.

In example embodiments, the changing of the widths of the fin portions may include etching the fin portions provided on the first region.

In example embodiments, the method may further include forming device isolation layers on lower sidewalls of the fin portions. The device isolation layers may be formed after the etching of the fin portions.

In example embodiments, the forming of the fin portions may include forming second mask patterns on the substrate, and etching the substrate using the second mask patterns as an etch mask. The etching of the fin portions may include etching sidewalls of the fin portions and a top surface of the substrate exposed by the first and second mask patterns.

In example embodiments, the method may further include forming device isolation layers on lower sidewalls of the fin portions. The device isolation layers may be formed before the etching of the fin portions, and the etching of the fin portions may include etching top surfaces and upper sidewalls of the fin portions exposed by the first mask pattern and the device isolation layers.

In example embodiments, the forming of the fin portions may include forming second mask patterns on the substrate, and etching the substrate using the second mask patterns as an etch mask. The forming of the second mask patterns may include forming third mask patterns on the substrate, performing a spacer-forming process to form the second mask patterns on sidewalls of the third mask patterns, and removing the third mask patterns.

In example embodiments, widths of the second mask patterns may be substantially equal to each other.

According to other example embodiments of the inventive concepts, a method of forming field effect transistors may include preparing a substrate with a first region and a second region, forming first mask patterns on the substrate, the first mask patterns being spaced apart from each other by a second width and having a first width different from the second width, forming second mask patterns to fill gap regions between the first mask patterns and have the second width, removing the first mask patterns from the second region, removing the second mask patterns from the first region, and etching the substrate using the first mask patterns on the first region and the second mask patterns on the second region as an etch mask to define first and second fin-shaped transistor channel regions of different widths protruding from the first and second regions, respectively.

In example embodiments, the forming of the first mask patterns may include forming third mask patterns on the substrate, performing a spacer-forming process to form the first mask patterns on sidewalls of the third mask patterns, and removing the third mask patterns.

BRIEF DESCRIPTION OF THE DRAWINGS

Example embodiments will be more clearly understood from the following brief description taken in conjunction with the accompanying drawings.

FIGS. 1, 3, 5, 7, 9, and 11 are perspective views illustrating methods of forming a field effect transistor according to example embodiments of the inventive concept.

FIGS. 2, 4, 6, 8, 10, and 12 are sectional views taken along line A-A' of FIGS. 1, 3, 5, 7, 9, and 11, respectively.

FIGS. 13, 15, 17, and 19 are perspective views illustrating methods of forming a field effect transistor according to other example embodiments of the inventive concept.

FIGS. 14, 16, 18, and 20 are sectional views taken along line A-A' of FIGS. 13, 15, 17, and 19, respectively.

FIGS. 21 and 23 are perspective views illustrating methods of forming a field effect transistor according to still other example embodiments of the inventive concept.

FIGS. 22 and 24 are sectional views taken along line A-A' of FIGS. 21 and 23, respectively.

FIGS. 25 and 27 are perspective views illustrating methods of forming a field effect transistor according to yet other example embodiments of the inventive concept.

FIGS. 26 and 28 are sectional views taken along line A-A' of FIGS. 25 and 27, respectively.

FIGS. 29, 31, 33, 35, 37, 39, and 41 are perspective views illustrating methods of forming a field effect transistor according to even other example embodiments of the inventive concept.

FIGS. 30, 32, 34, 36, 38, 40 and 42 are sectional views taken along line A-A' of FIGS. 29, 31, 33, 35, 37, 39, and 41, respectively.

FIG. 43 is a block diagram illustrating an electronic system including a field effect transistor according to example embodiments of the inventive concepts.

Figure 1:
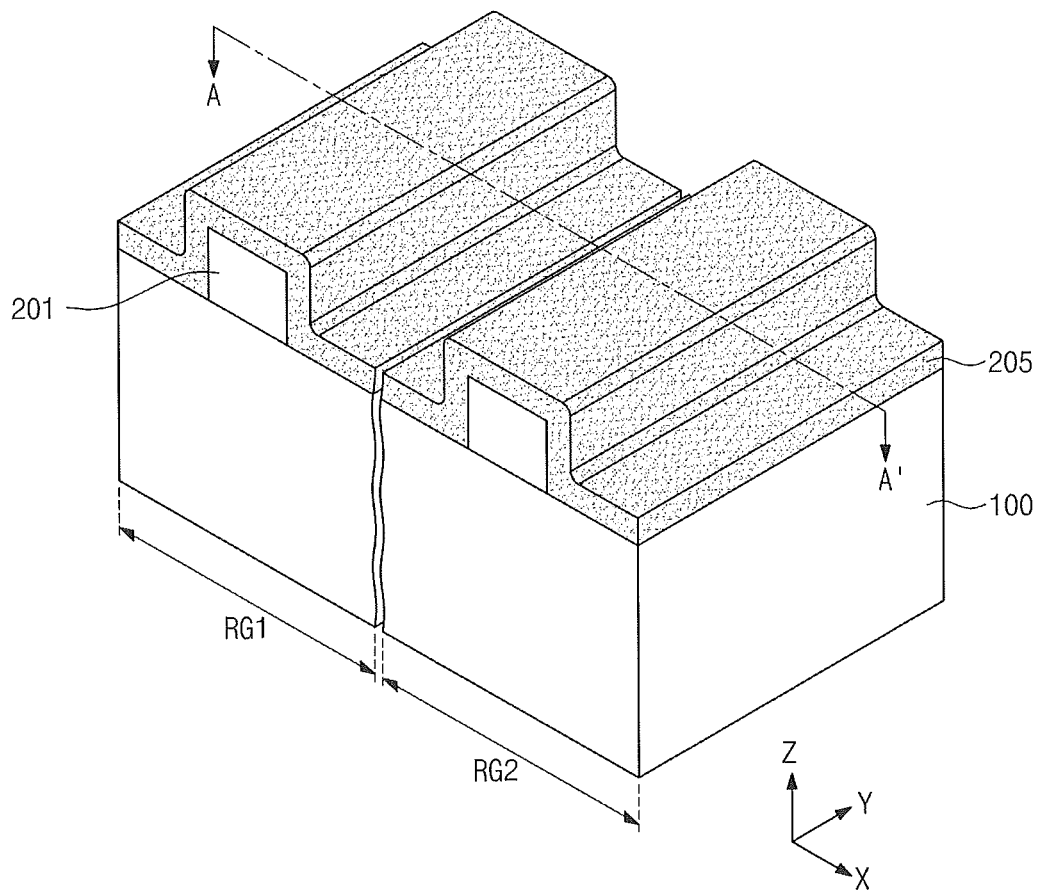
FIGS. 1 through 43 represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EMBODIMENTS

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Methods of forming a field effect transistor according to example embodiments of the inventive concepts will be described with reference to FIGS. 1 through 12. FIGS. 1, 3, 5, 7, 9, and 11 are perspective views illustrating methods of forming a field effect transistor according to example embodiments of the inventive concept, and FIGS. 2, 4, 6, 8, 10, and 12 are sectional views taken along line A-A' of FIGS. 1, 3, 5, 7, 9, and 11, respectively.

Figure 2:
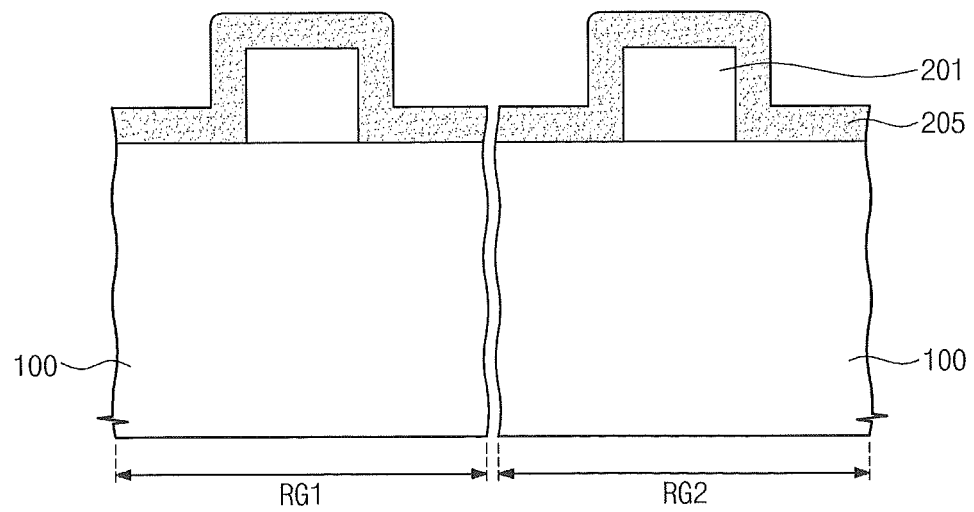

Referring to FIGS. 1 and 2, a substrate 100 including a first region RG1 and a second region RG2 may be provided. The substrate 100 may include a semiconductor based structure. In example embodiments, the substrate 100 may be a silicon substrate or a silicon-on-insulator (SOI) substrate. The first region RG1 and the second region RG2 may be two different regions provided with elements, whose threshold voltages are different with each other. For example, the first region RG1 and the second region RG2 may be an NMOS transistor region and a PMOS transistor region, respectively.

First mask patterns 201 may be formed on the substrate 100. A second mask layer 205 may be formed on the substrate 100 provided with the first mask patterns 201. The second mask layer 205 may be formed to conformally cover the substrate 100 provided with the first mask patterns 201. The first mask patterns 201 and the second mask layer 205 may be formed of materials having etch selectivity with each other. For example, the second mask layer 205 and the first mask patterns 201 may include different materials selected from the group consisting of silicon oxide, silicon nitride, silicon oxynitride, photoresist materials, spin-on-glass (SOG) materials, and/or spin-on-hardmask (SOH) materials. The first mask patterns 201 and the second mask layer 205 may be formed by at least one of a physical vapor deposition (PVD), a chemical vapor deposition (CVD), an atomic layer deposition, or a spin coating process.

Figure 3:
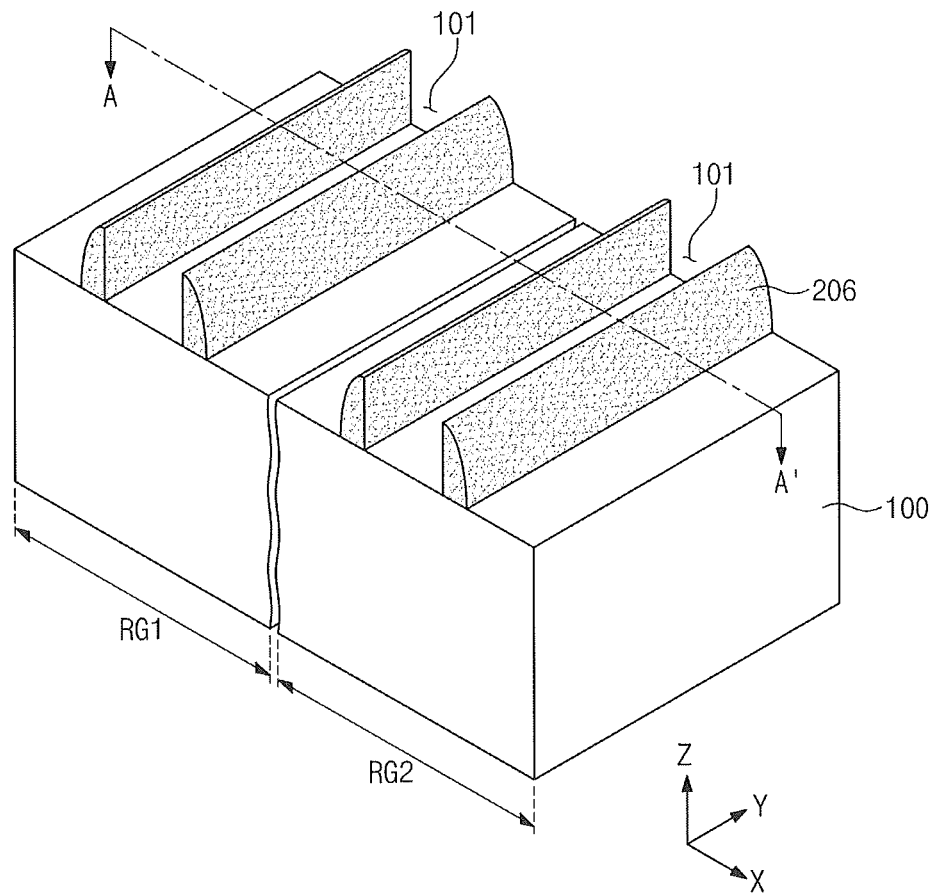
Figure 4:
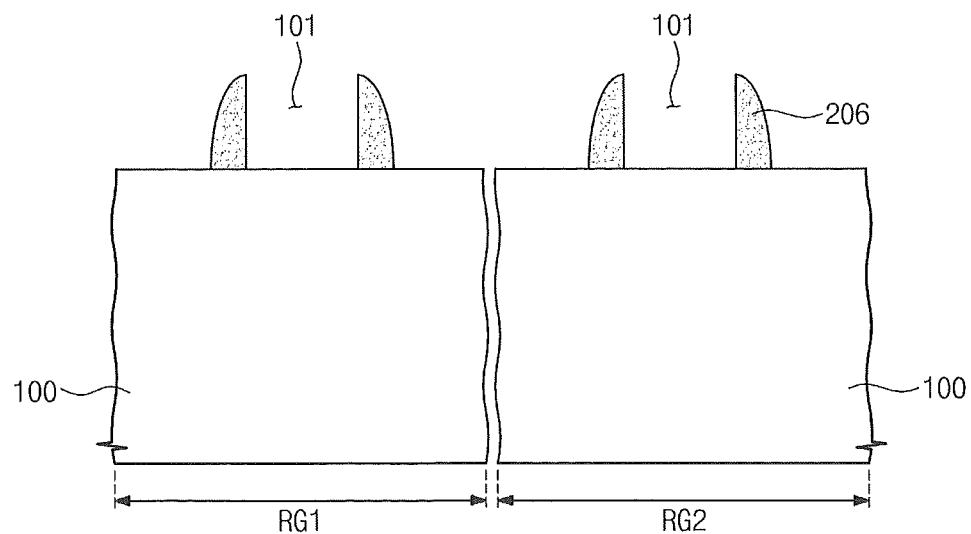

Referring to FIGS. 3 and 4, a spacer forming process may be performed on the second mask layer 205 to form second mask patterns 206. The second mask patterns 206 may be formed to expose the first mask patterns 201, thereby having a spacer shape. For example, the spacer forming process may include a plasma etching process performed in an anisotropic manner. The second mask patterns 206 may have the substantially same width as each other. Hereinafter, for fin portions or mask patterns, a width may be a dimension measured along an x-direction. The first mask patterns 201 exposed by the second mask patterns 206 may be removed to form first trenches 101 between the second mask patterns 206. The removal of the first mask patterns 201 may include a selective etching process, which may be performed in such a way that the second mask patterns 206 is suppressed from being etched.

Figure 5:
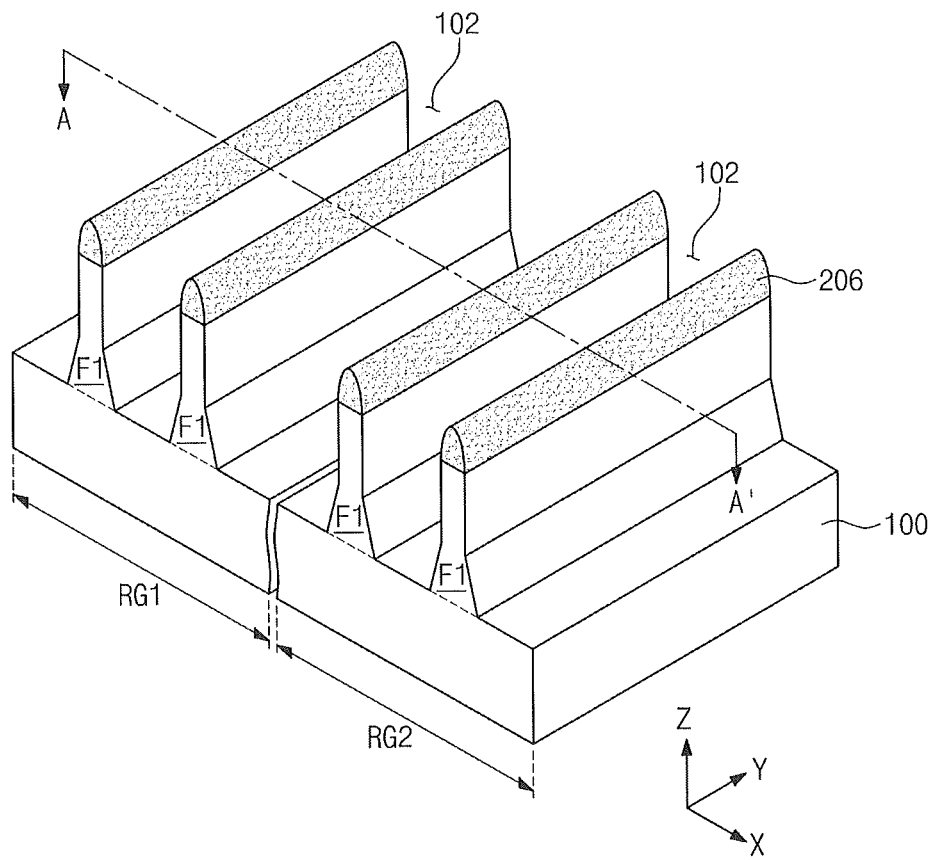
Figure 6:
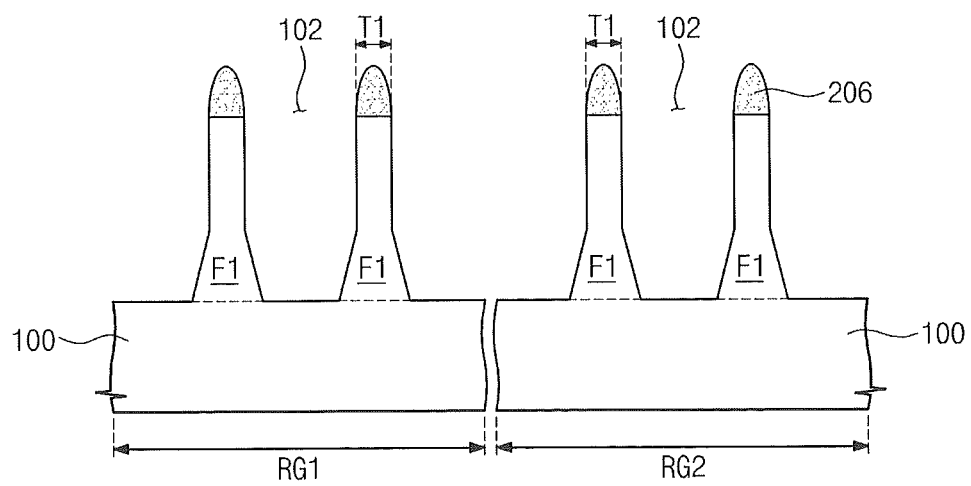

Referring to FIGS. 5 and 6, the substrate 100 may be etched using the second mask patterns 206 as an etch mask to form first fin portions F1 (also referred to herein fin-shaped transistor active regions or channel regions) having a first width T1. Hereinafter, a width of the fin portion F1 may be an upper width of the fin portion. As the result of the etching process, second trenches 102 may be formed between the first fin portions F1. In addition, upper portions of the second mask patterns 206 may be etched during the etching process, such that the second mask patterns 206 may have a rounded profile. The first fin portions F1 may be linear or shaped like a line pattern extending along a y-direction. In other example embodiments, in the case where the substrate 100 is an SOI substrate including first and second semiconductor layers and a dielectric layer interposed therebetween, the first fin portions F1 may be formed by patterning the second semiconductor layer on the dielectric layer. The first fin portions F1 may be doped with impurities to control a threshold voltage of transistors to be provided there. For example, a doping process may be performed to an upper portion of the substrate 100, before the formation of the first mask patterns 201 described with reference to FIGS. 1 and 2. Although the drawings show a plurality of the fin portions provided on each of the first and second regions RG1 and RG2, the fin portion may be solely provided on each of the first and second regions RG1 and RG2. The plurality of the first fin portions F1 on the second region RG2 may be used to define different transistors from each other or one transistor. The plurality of second fin portions F2 to be provided on the first region RG1 may be used to define different transistors from each other or one transistor.

Figure 7:
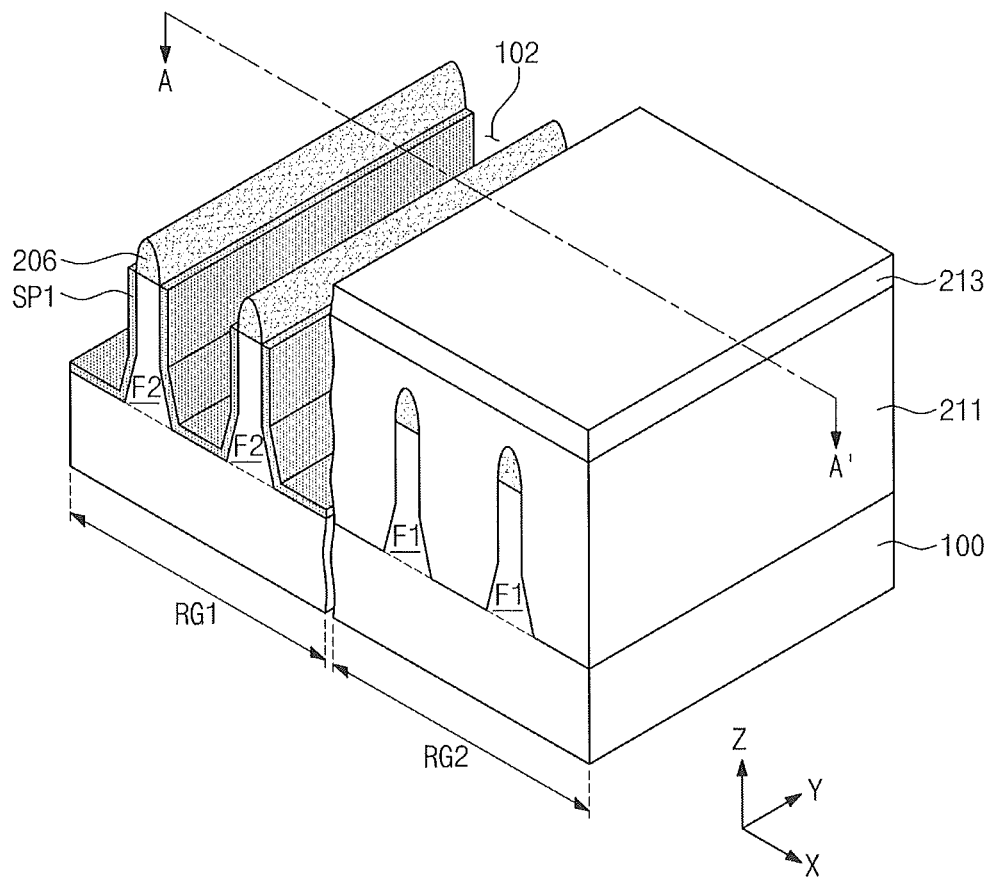
Figure 8:
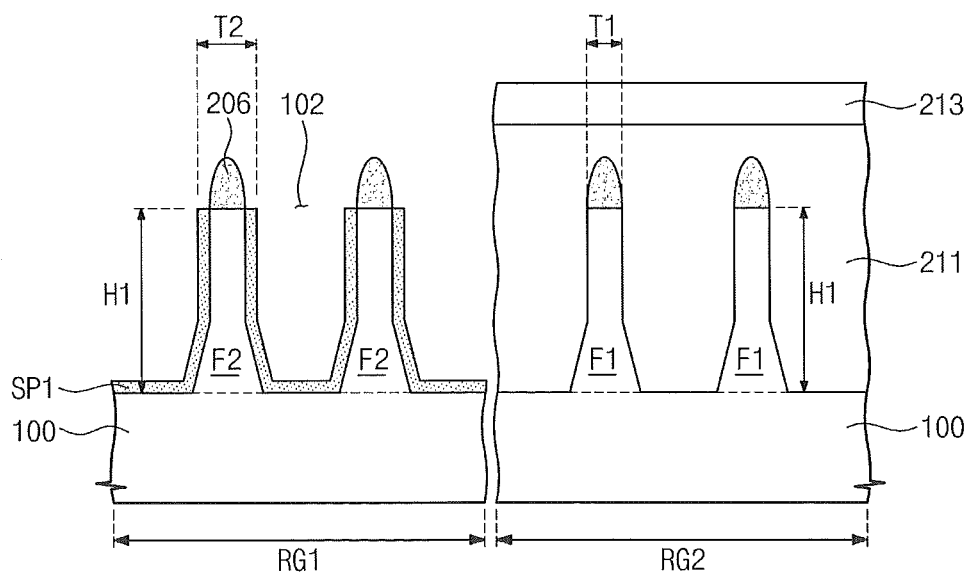

Referring to FIGS. 7 and 8, an epitaxial-growth preventing mask pattern 211 may be formed to cover the second region RG2 and expose the first region RG1. The formation of the epitaxial-growth preventing mask pattern 211 may include sequentially forming an epitaxial-growth preventing layer and a third mask pattern 213 to cover the first and second regions RG1 and RG2, and then, removing the epitaxial-growth preventing layer from the first region RG1 using the third mask pattern 213 as an etch mask. In example embodiments, the epitaxial-growth preventing mask pattern 211 may be formed of a material having etching selectivity with respect to the second mask patterns 206. For example, the second mask patterns 206 may include at least one selected from the group consisting of silicon oxide, silicon nitride, silicon oxynitride, photoresist materials, spin-on-glass (SOG) materials, and/or spin-on-hardmask(S OH) materials, and the epitaxial-growth preventing mask pattern 211 may include a material selected from these materials but different from the second mask patterns 206. The third mask pattern 213 may include at least one of silicon oxide, silicon nitride, silicon oxynitride, or photoresist materials.

The widths of the first fin portions F1 provided on the first region RG1 may be increased or decreased. In the present embodiment, an epitaxy process, in which the first fin portions F1 on the first region RG1 are used as a seed layer, may be performed to form first semiconductor layers SP1. For example, the first semiconductor layers SP1 may be formed by a molecular beam epitaxy (MBE), a liquid phase epitaxy (LPE), a vapor phase epitaxy (VPE), or a metal-organic chemical vapor deposition (MOCVD). The first semiconductor layers SP1 may be formed to conformally cover surfaces of the second trenches 102. For example, the first semiconductor layers SP1 may cover sidewalls of the first fin portions F1, which may be exposed by the epitaxial-growth preventing mask pattern 211 and the second mask patterns 206, and top surfaces of the substrate 100 between the first fin portions F1. Hereinafter, unless mentioned otherwise, bottom surfaces of the second trenches 102 between the first fin portions F1 may be referred to as the top surface of the substrate 100, and the first semiconductor layers SP1 and the first fin portions F1 covered thereby may be collectively referred to as second fin portions F2. As a result, each of the second fin portions F2 may have a second width T2 greater than the first width T1. Here, the second width T2 may be defined as a sum of the first width T1 and a thickness of the semiconductor layer. In example embodiments, since top surfaces of the first fin portions F1 are covered with the second mask patterns 206, the first semiconductor layers SP1 may be prevented from being grown from the top surfaces of the first fin portions F1. As a result, top surfaces of the first and second fin portions F1 and F2 may be positioned at the substantially same vertical height H1 from the top surface of the substrate 100.

A fin-type field effect transistor (hereinafter, referred as to a "fin-FET" or "finFET") may use a fin portion protruding from a substrate as a body or channel region thereof and thus have an improved short channel effect compared with a planar-type transistor. However, since the channel region of the fin-FET is narrower than the planar-type transistor, there may be a difficulty in an ion implantation process for controlling a threshold voltage of the fin-FET. In the case where the fin portions of fin-FETs have different widths from each other, the fin-FETs may have channel regions whose volumes are different from each other. Based on this difference in fin width, an ion implantation process can be used to make threshold voltages of the fin-FETs different from each other. According to example embodiments of the inventive concepts, fin portions having widths different from each other may be formed, which can enable the fabrication of transistors having threshold voltages different from each other.

The first semiconductor layers SP1 may be formed of a same or similar material as the first fin portions F1 or a material having different lattice constant and/or bandgap from the first fin portions F1. For example, the first fin portions F1 may be parts of a single crystalline silicon wafer, while the first semiconductor layers SP1 may include at least one of InSb, InAs, GaSb, InP, GaAs, Ge, SiGe, or SiC. The first semiconductor layers SP1 may include a semiconductor material having a different bandgap from the first fin portions F1. For example, the first fin portions F1 may include GaAs and the first semiconductor layers SP1 may include AlGaAs. The first semiconductor layers SP1 may have the same conductivity type as the first fin portions F1. For example, the first semiconductor layers SP1 may be doped in an in-situ manner during the epitaxy process, and a doping concentration of the first semiconductor layers SP1 may be different from that of the first fin portions F1. In example embodiments, the first semiconductor layers SP1 may have the doping concentration smaller than that of the first fin portions F1.

Figure 9:
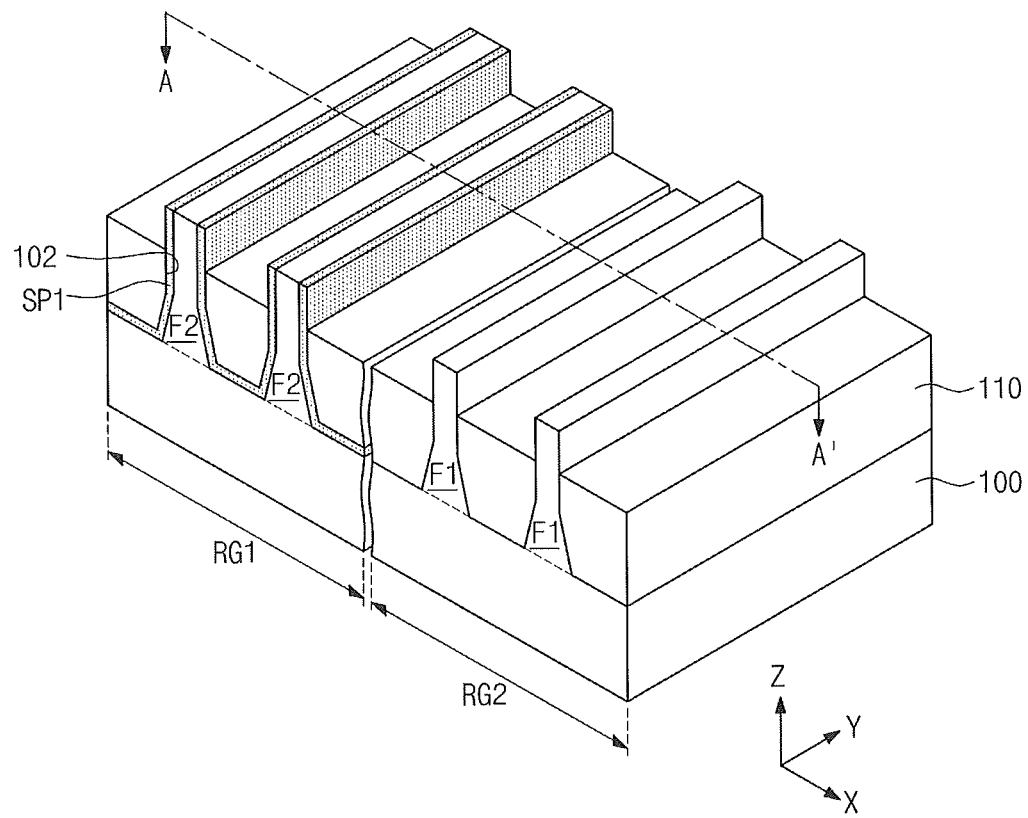
Figure 10:
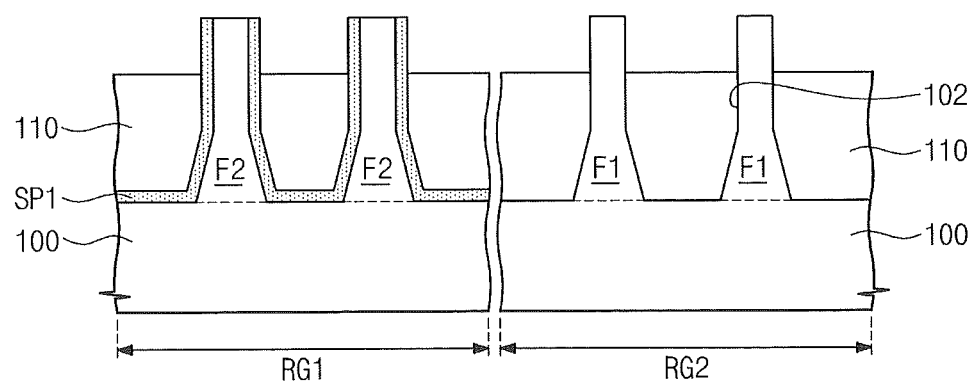

Referring to FIGS. 9 and 10, the second mask patterns 206, the epitaxial-growth preventing mask pattern 211, and the third mask pattern 213 may be removed. The removal of the second mask patterns 206, the epitaxial-growth preventing mask pattern 211, and the third mask pattern 213 may include a plurality of selective etching processes. After the removal process, device isolation layers 110 may be formed to fill the second trenches 102 between the first and second fin portions F1 and F2. In example embodiments, the formation of the device isolation layers 110 may include forming a dielectric layer to cover the first and second regions RG1 and RG2, and then, etching the dielectric layer to expose upper portions of the first and second fin portions F1 and F2. The device isolation layers 110 may be formed of a high-density plasma oxide layer, a spin on glass (SOG) layer, and/or a CVD oxide layer.

Figure 11:
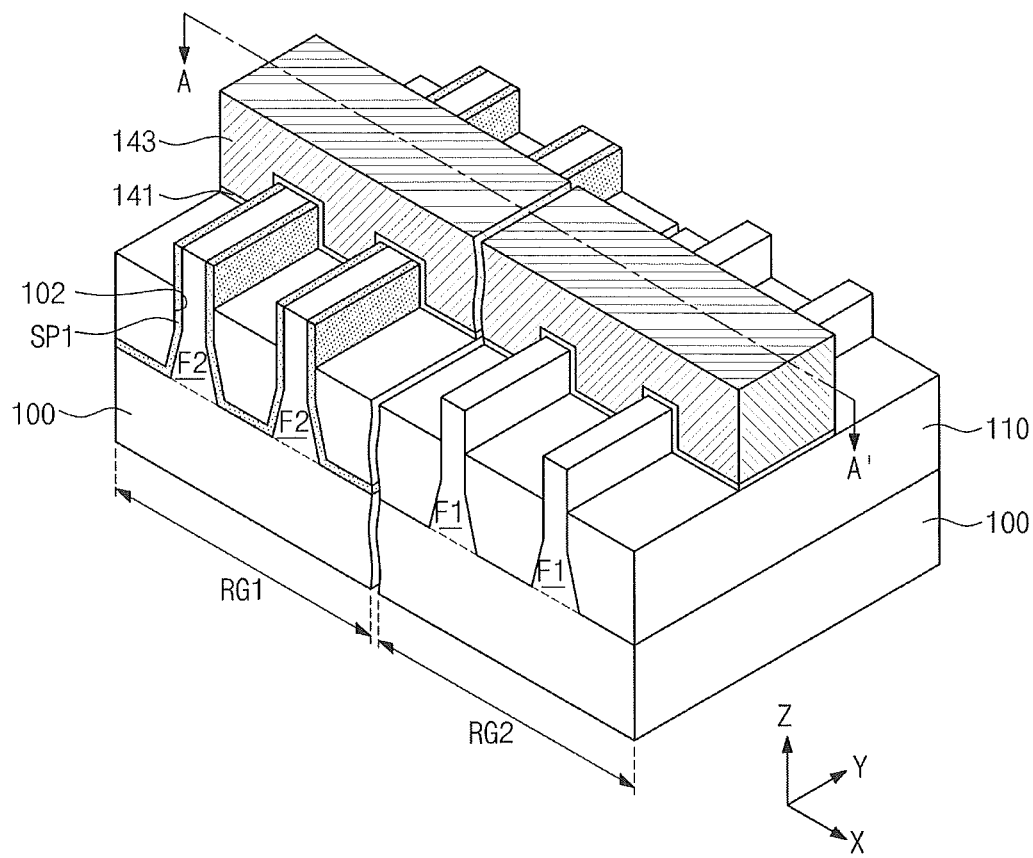
Figure 12:
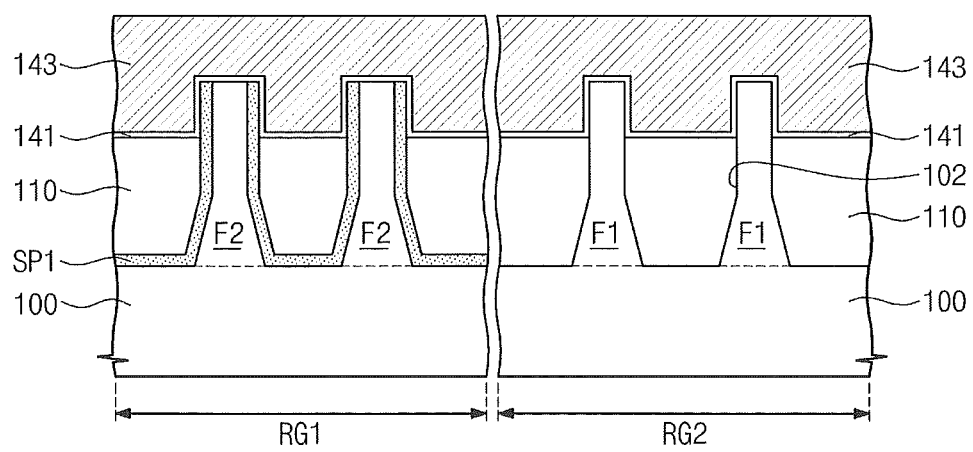

Referring to FIGS. 11 and 12, a gate dielectric pattern 141 and a gate electrode pattern 143 may be sequentially formed on the first and second fin portions F1 and F2. The formation of the gate dielectric pattern 141 and the gate electrode pattern 143 may include sequentially forming a gate dielectric and a gate electrode layer on the structure provided with the device isolation layers 110, and then, etching the gate dielectric and the gate electrode layer using an etch mask. The gate dielectric pattern 141 may include an oxide layer or an oxynitride layer. For example, the gate dielectric pattern 141 may be a silicon oxide layer. The gate dielectric pattern 141 may include a high-k dielectric having a dielectric constant greater than the silicon oxide layer. The gate electrode pattern 143 may include at least one of doped semiconductors, metals, conductive metal nitrides, or metal-semiconductor compounds. In example embodiments, each of the gate dielectric pattern 141 and the gate electrode pattern 143 may be formed by a chemical vapor deposition, a sputtering process, and/or an atomic layer deposition. Thereafter, source/drain regions may be formed in the upper portions of the first and second fin portions F1 and F2 exposed by the gate electrode pattern 143.

According to example embodiments of the inventive concepts, it is possible to form the fin portions having different widths with each other. This enables to form fin-FETs with threshold voltages different from each other.

A method of forming a field effect transistor according to other example embodiments of the inventive concept will be described with reference to FIGS. 13 through 20. FIGS. 13, 15, 17, and 19 are perspective views illustrating methods of forming a field effect transistor according to other example embodiments of the inventive concept, and FIGS. 14, 16, 18, and 20 are sectional views taken along line A-A' of FIGS. 13, 15, 17, and 19, respectively. For conciseness, a previously described element may be identified by a similar or identical reference number without repeating an overlapping description thereof Referring to FIGS. 13 and 14, the first fin portions F1 may be formed to protrude from the substrate 100. The first fin portions F1 may be formed by an etching process using a mask pattern provided on the substrate 100 as an etch mask. For example, the first fin portions F1 may be formed by the method described with reference to FIGS. 1 through 6, and thus, have the same width as each other. The device isolation layers 110 may be formed to cover lower sidewalls of the first fin portions F1. The formation of the device isolation layers 110 may include forming a dielectric layer to cover the first and second regions RG1 and RG2, and then, etching the dielectric layer to expose upper portions of the first fin portions F1. In example embodiments, the device isolation layers 110 may be formed of a high-density plasma oxide layer, a spin on glass (SOG) layer, and/or a CVD oxide layer. In other example embodiments, the formation of the first fin portions F1 may include an epitaxy process, which may be performed after forming the mask pattern on the substrate 100. Top surfaces of the substrate 100 exposed by the mask pattern may be used as a seed layer in the epitaxy process. In this case, the first fin portions F1 may be formed of a same or similar material as the substrate 100 or a material having different lattice constant and/or bandgap from the substrate 100. For example, the substrate 100 may be a single crystalline silicon wafer, while the first fin portions F1 may include at least one of Ge, SiGe, or SiC.

Figure 15:
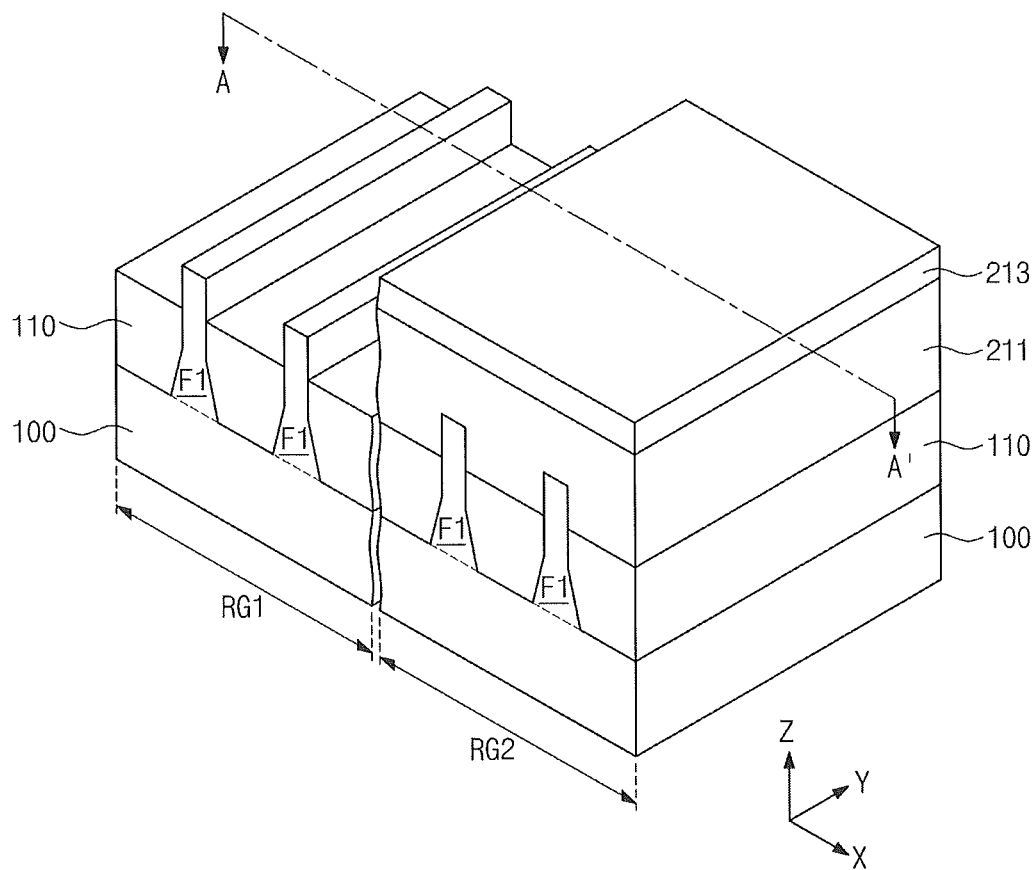
Figure 16:
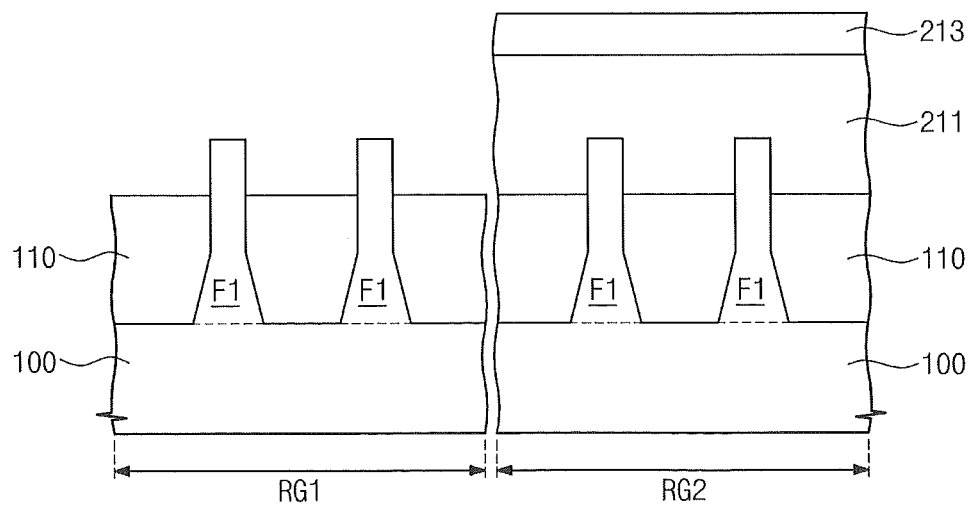

Referring to FIGS. 15 and 16, the epitaxial-growth preventing mask pattern 211 may be formed on the structure provided with the device isolation layers 110 to cover the second region RG2 and expose the first region RG1. The formation of the epitaxial-growth preventing mask pattern 211 may include forming an epitaxial-growth preventing layer and a third mask pattern 213 to cover the first and second regions RG1 and RG2, and then, removing the epitaxial-growth preventing layer from the first region RG1 using the third mask pattern 213 as an etch mask. In example embodiments, the epitaxial-growth preventing mask pattern 211 may be formed of a material having etch selectivity with respect to the device isolation layers 110. For example, the device isolation layers 110 may include at least one selected from the group consisting of silicon oxide, silicon nitride, silicon oxynitride, photoresist materials, spin-on-glass (SOG) materials, and/or spin-on-hardmask(SOH) materials, and the epitaxial-growth preventing mask pattern 211 may include a material selected from these materials but different from the device isolation layers 110. The third mask pattern 213 may include at least one of silicon oxide, silicon nitride, silicon oxynitride, or photoresist materials.

Figure 17:
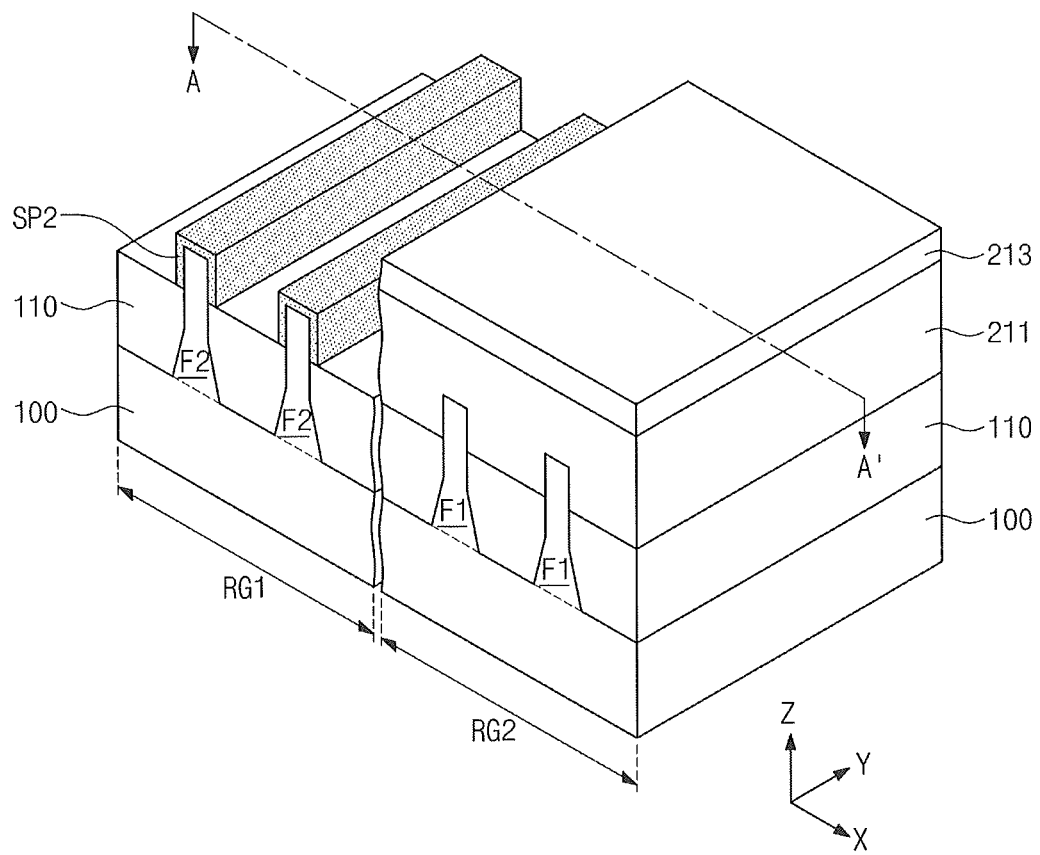
Figure 18:
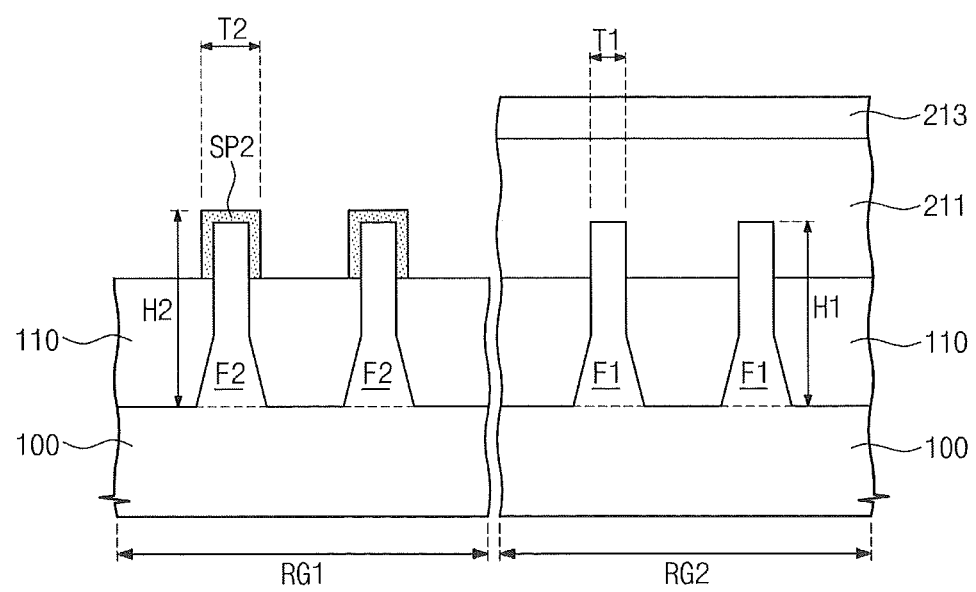

Referring to FIGS. 17 and 18, a process may be performed to increase or decrease upper widths of fin portions provided on the first region RG1. In the present embodiment, an epitaxy process, in which the exposed upper portions of the first fin portions F1 on the first region RG1 are used as a seed layer, may be performed to form second semiconductor layers SP2. For example, the second semiconductor layers SP2 may be formed by a molecular beam epitaxy (MBE), a liquid phase epitaxy (LPE), a vapor phase epitaxy (VPE), or a metal-organic chemical vapor deposition (MOCVD). Structures including the second semiconductor layers SP2 and the first fin portions F1 may be collectively referred to as second fin portions F2, respectively. Here, upper portions of the second fin portions F2 may have a second width T2 greater than the first width T1 of the first fin portions F1 provided on the second region RG2. Due to the presence of the second semiconductor layers SP2, a height H2 of the second fin portion F2 may be higher than a height H1 of the first fin portion F1, when measured from the top surface of the substrate 100.

The second semiconductor layers SP2 may be formed of a same or similar material as the first fin portions F1 or a material having different lattice constant and/or bandgap from the first fin portions F1, For example, the first fin portions F1 may be a single crystalline silicon wafer, and the second semiconductor layers SP2 may include at least one of InSb, InAs, GaSb, InP, GaAs, Ge, SiGe, or SiC. The second semiconductor layers SP2 may include a semiconductor material having a different bandgap from the first fin portions F1. For example, the first fin portions F1 may include GaAs and the second semiconductor layers SP2 may include AlGaAs. The second semiconductor layers SP2 may have the same conductivity type as the first fin portions F1. For example, the second semiconductor layers SP2 may be doped in an in-situ manner during the epitaxy process, and a doping concentration of the second semiconductor layers SP2 may be different from that of the first fin portions F1. In example embodiments, the second semiconductor layers SP2 may have the doping concentration smaller than that of the first fin portions F1.

Figure 19:
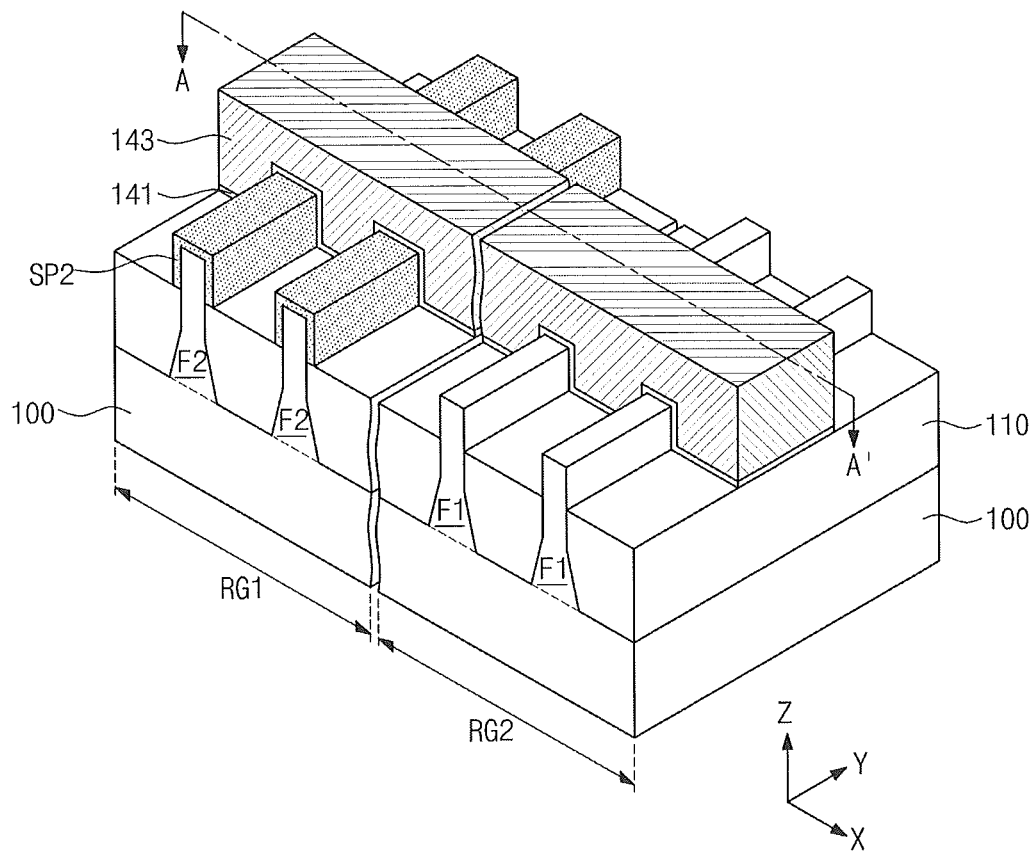
Figure 20:
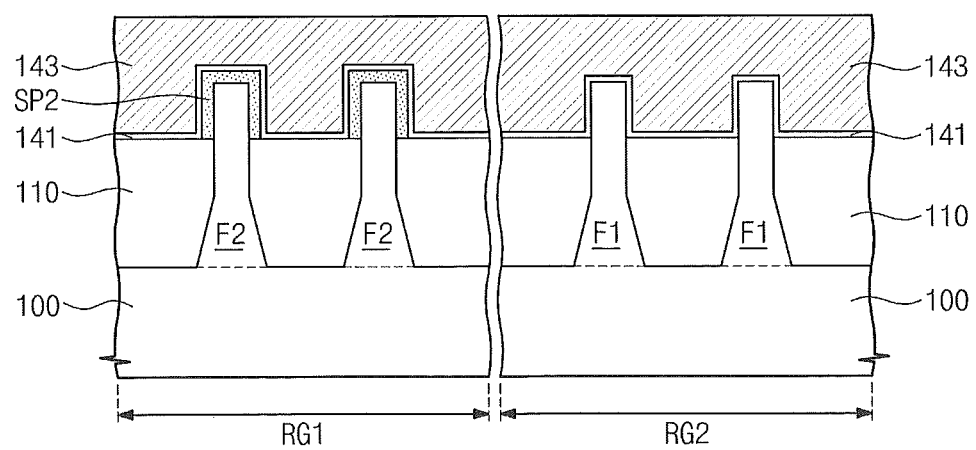

Referring to FIGS. 19 and 20, the epitaxial-growth preventing mask pattern 211 and the third mask pattern 213 may be removed. Thereafter, the gate dielectric pattern 141 and the gate electrode pattern 143 may be sequentially formed on the first and second fin portions F1 and F2. The gate dielectric pattern 141 and the gate electrode pattern 143 may be formed using a same or similar process as that described with reference to FIGS. 11 and 12.

Figure 21:
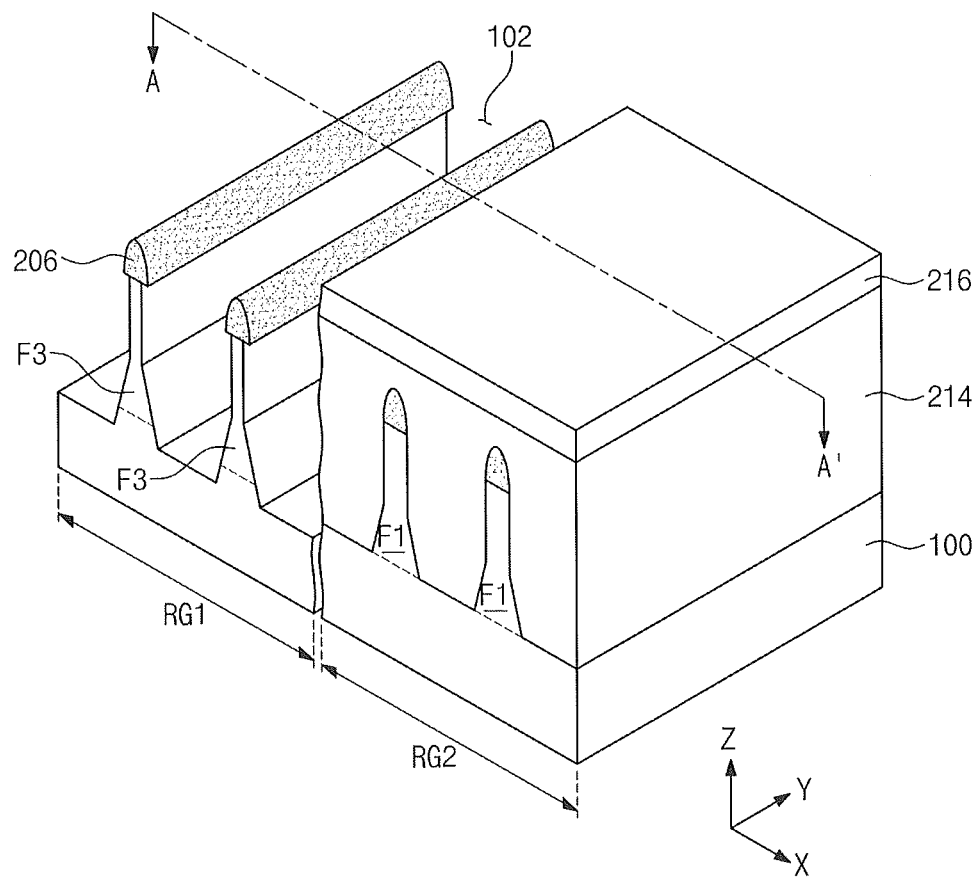
Figure 22:
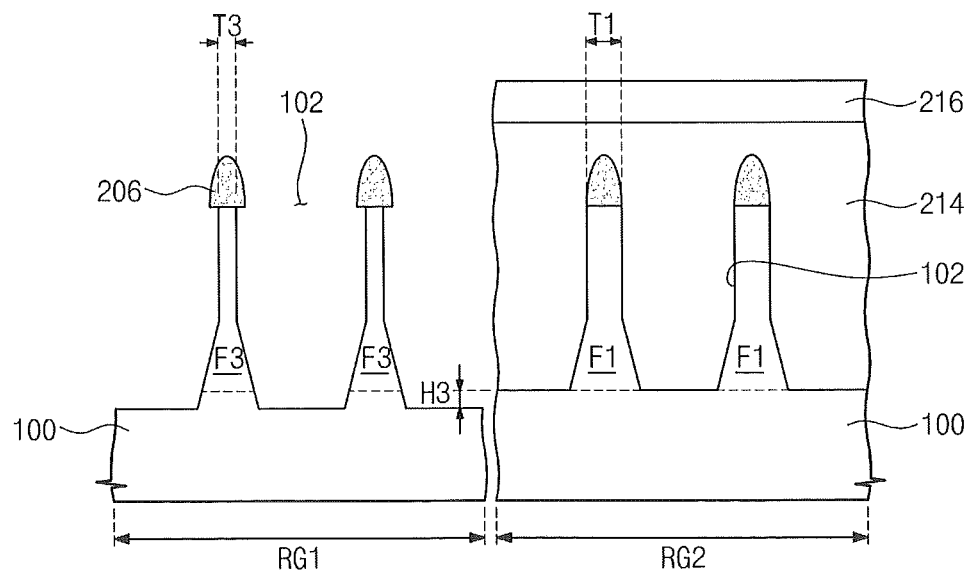
Figure 23:
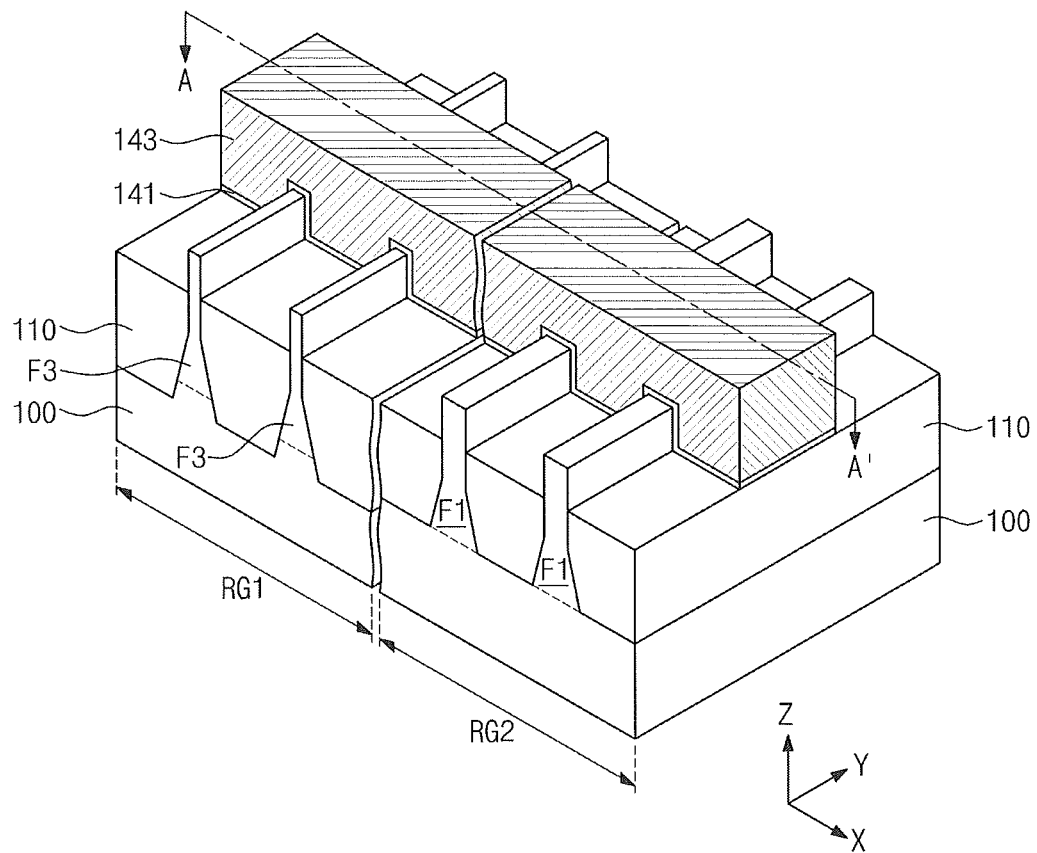
Figure 24:
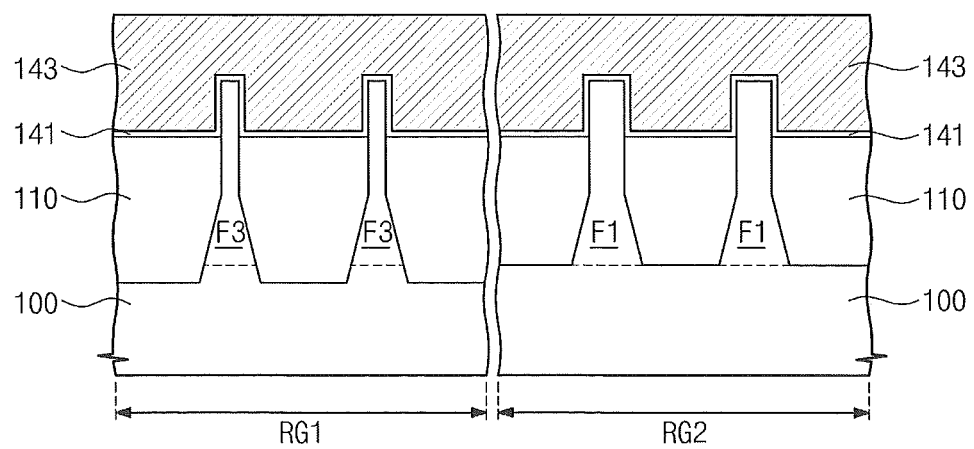

A method of forming a field effect transistor according to still other example embodiments of the inventive concept will be described with reference to FIGS. 21 through 24. FIGS. 21 and 23 are perspective views illustrating methods of forming a field effect transistor according to still other example embodiments of the inventive concept, and FIGS. 22 and 24 are sectional views taken along line A-A' of FIGS. 21 and 23, respectively. For conciseness, a previously described element may be identified by a similar or identical reference number without repeating an overlapping description thereof.

Referring to FIGS. 21 and 22, an etching mask pattern 214 may be formed on the structure described with reference to FIGS. 5 and 6. The etching mask pattern 214 may be formed to cover the second region RG2 and expose the first region RG1, The formation of the etching mask pattern 214 may include sequentially forming an etch mask layer and a fourth mask pattern 216 on the structure provided with the first fin portions F1, and then, removing the etch mask layer from the first region RG1 using the fourth mask pattern 216 as an etch mask. The etching mask pattern 214 may be formed of a material having etch selectivity with respect to the second mask patterns 206. In example embodiments, the second mask patterns 206 may include at least one selected from the group consisting of silicon oxide, silicon nitride, silicon oxynitride, photoresist materials, spin-on-glass (SOG) materials, and/or spin-on-hardmask (SOH) materials, and the etching mask pattern 214 may include a material selected from these materials but different from the second mask patterns 206. The fourth mask pattern 216 may include at least one of silicon oxide, silicon nitride, silicon oxynitride, or photoresist materials.

The widths of the first fin portions F1 provided on the first region RG1 may be increased or decreased. In the present embodiment, the first fin portions F1 with the first width T1 may be laterally etched to form third fin portions F3 with a third width T3. The etching process may be performed in a dry and/or wet etching manner. For example, the etching process may include an isotropy etching process. The third width T3 may be smaller than the first width T1. In embodiments where the substrate 100 was doped before the formation of the fin portions F1, the etching process may result in fin portions F1 and F3 having different doping amounts, such that transistors subsequently formed on the fin portions F1 and F3 may have different threshold voltages. Top surfaces of the substrate 100, which may serve as bottom surfaces of the second trenches 102, may also be etched during the formation of the third fin portions F3 in some embodiments. As a result, the first region RG1 may be different from the second region RG2 in terms of vertical height of the top surface of the substrate 100, such that surfaces of the first region RG1 and the second region RG2 (from which the fin portions F3 and F1 protrude) may not be coplanar. For example, a height difference H3 may occur between the top surfaces of the first and second regions RG1 and RG2.

Referring to FIGS. 23 and 24, the second mask patterns 206, the etching mask pattern 214, and the fourth mask pattern 216 may be removed. After the removal process, the device isolation layers 110 may be formed to cover the lower sidewalls of the first and third fin portions F1 and F3. The gate dielectric pattern 141 and the gate electrode pattern 143 may be sequentially formed on the first and third fin portions F1 and F3. The gate dielectric pattern 141 and the gate electrode pattern 143 may be formed using a same or similar process as that described with reference to FIGS. 11 and 12.

Figure 25:
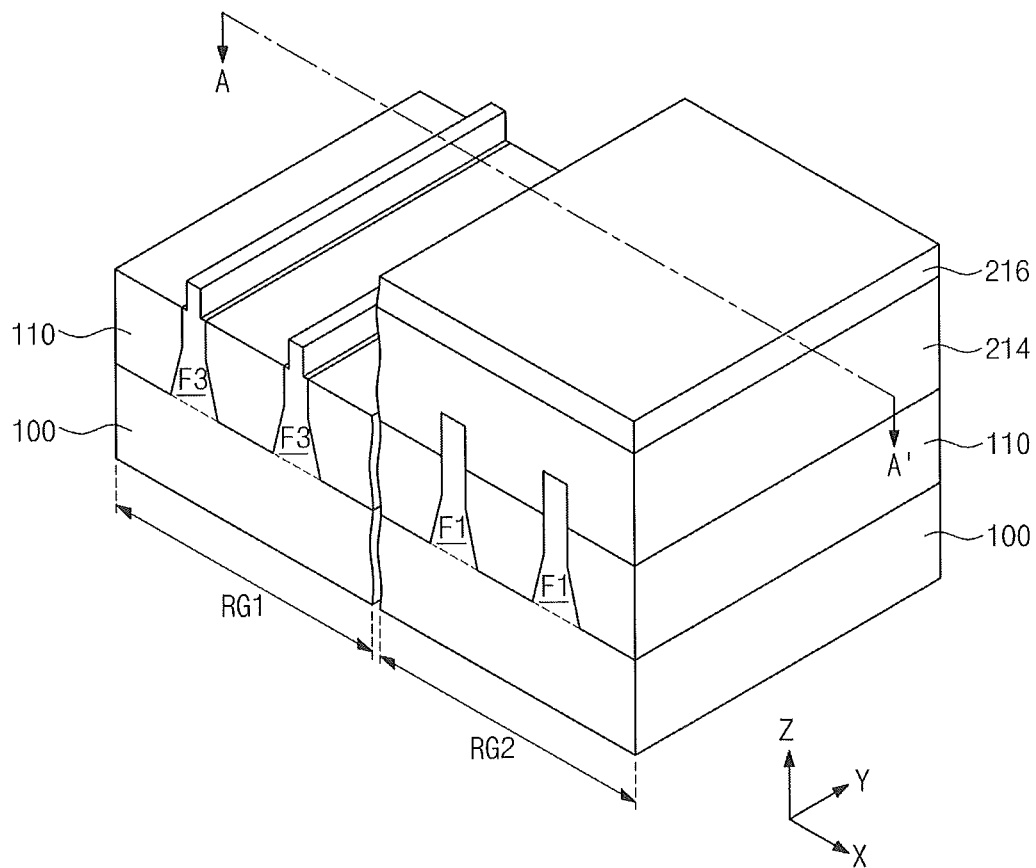
Figure 26:
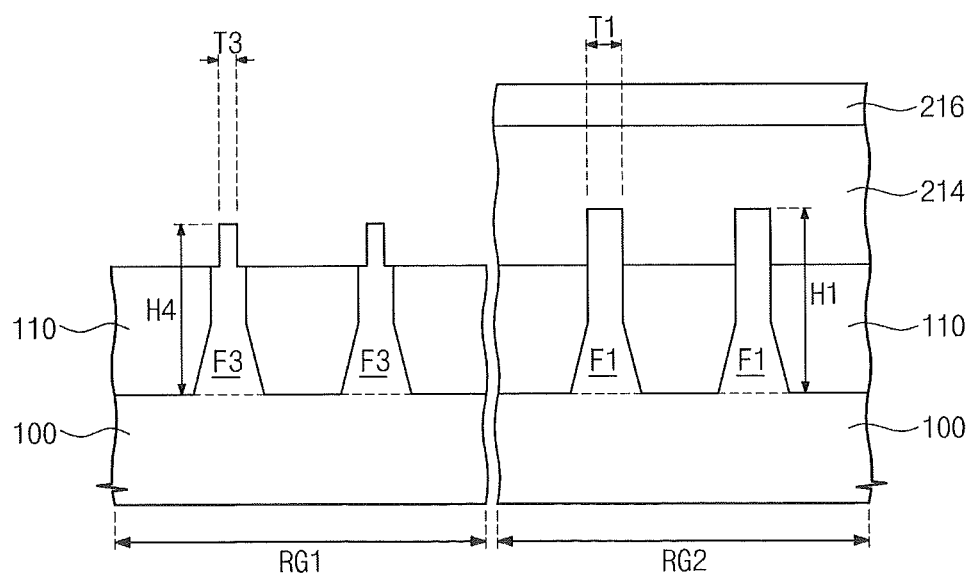
Figure 27:
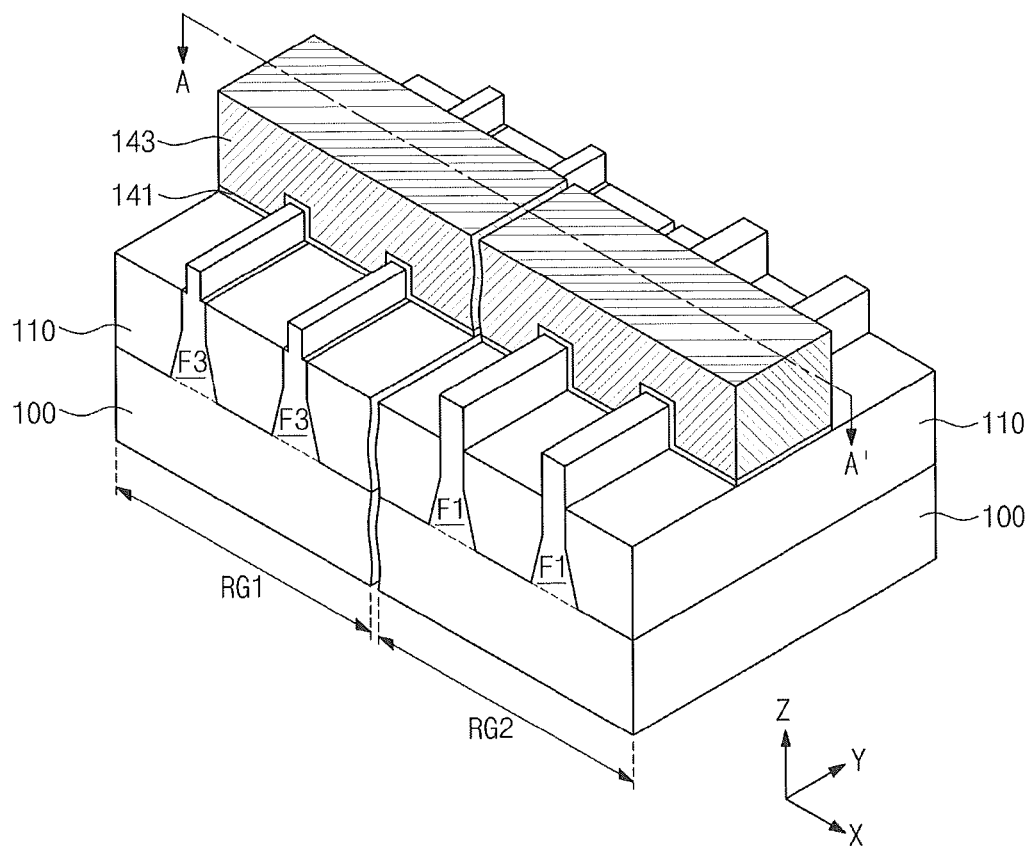
Figure 28:
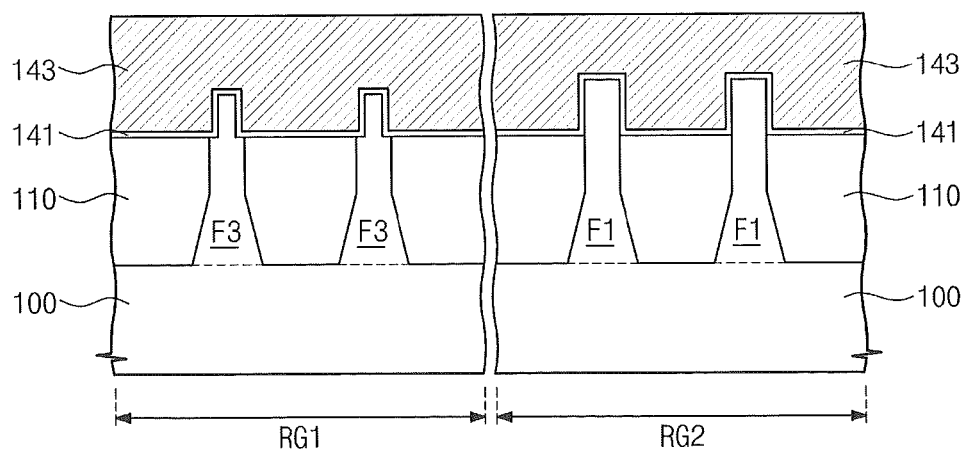

A method of forming a field effect transistor according to yet other example embodiments of the inventive concept will be described with reference to FIGS. 25 through 28. FIGS. 25 and 27 are perspective views illustrating methods of forming a field effect transistor according to yet other example embodiments of the inventive concept, and FIGS. 26 and 28 are sectional views taken along line A-A' of FIGS. 25 and 27, respectively. For conciseness, a previously described element may be identified by a similar or identical reference number without repeating an overlapping description thereof.

Figure 13:
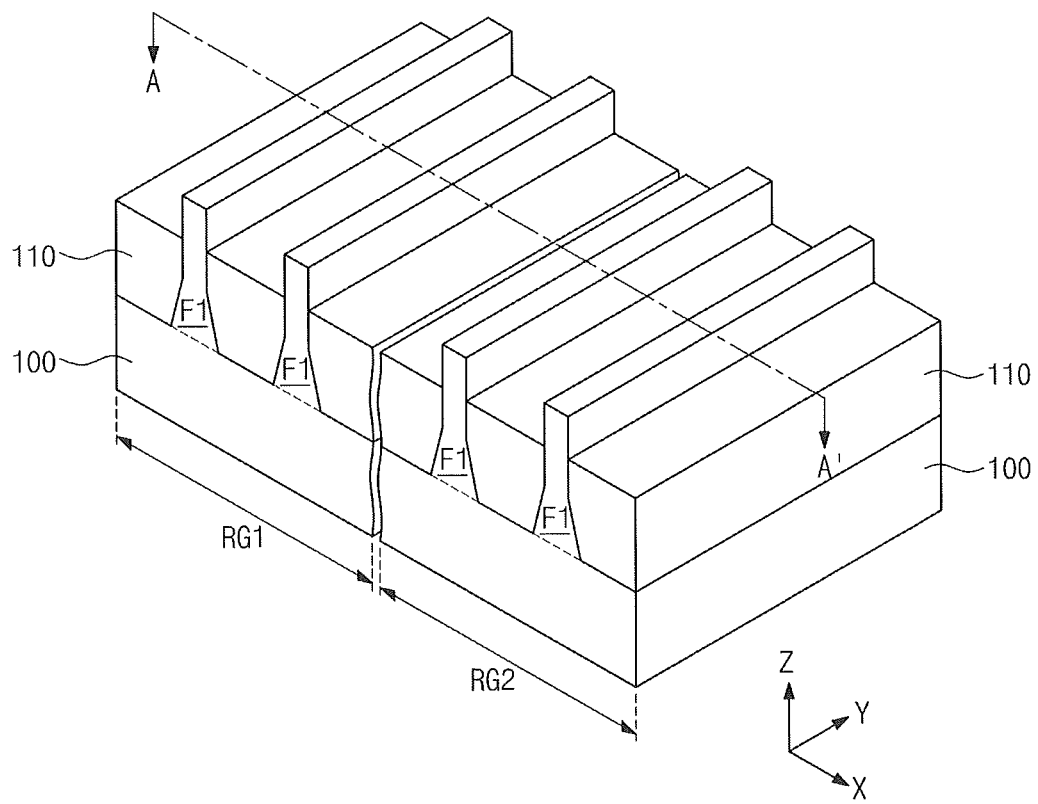
Figure 14:
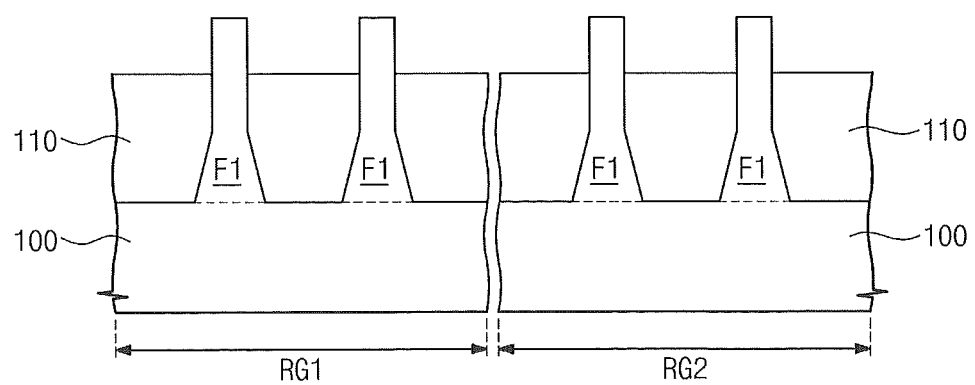

Referring to FIGS. 25 and 26, an etching mask pattern 214 may be formed on the structure described with reference to FIGS. 13 and 14. The etching mask pattern 214 may be formed to cover the second region RG2 and expose the first region RG1. The formation of the etching mask pattern 214 may include sequentially forming an etch mask layer and the fourth mask pattern 216 on the structure provided with the first fin portions F1, and then, removing the etch mask layer from the first region RG1 using the fourth mask pattern 216 as an etch mask.

The upper widths of the first fin portions F1 provided on the first region RG1 may be increased or decreased. In the present embodiment, upper sidewalls of the first fin portions F1 with the first width T1 may be etched to form the third fin portions F3, whose upper portions have the third width T3. The etching process may be performed in a dry and/or wet etching manner. For example, the etching process may include an isotropy etching process. The third width T3 may be smaller than the first width T1. As the result of the etching process, the third fin portions F3 may have a fourth height H4 smaller than the first height H1 of the first fin portions F1.

Referring to FIGS. 27 and 28, the etching mask pattern 214 and the fourth mask pattern 216 may be removed. After the removal process, the gate dielectric pattern 141 and the gate electrode pattern 143 may be sequentially formed on the first and third fin portions F1 and F3. The gate dielectric pattern 141 and the gate electrode pattern 143 may be formed using a same or similar process as that described with reference to FIGS. 11 and 12.

A method of forming a field effect transistor according to even other example embodiments of the inventive concept will be described with reference to FIGS. 29 through 42. FIGS. 29, 31, 33, 35, 37, 39, and 41 are perspective views illustrating methods of forming a field effect transistor according to even other example embodiments of the inventive concept, and FIGS. 30, 32, 34, 36, 38, 40 and 42 are sectional views taken along line A-A' of FIGS. 29, 31, 33, 35, 37, 39, and 41, respectively. For conciseness, a previously described element may be identified by a similar or identical reference number without repeating an overlapping description thereof.

Figure 29:
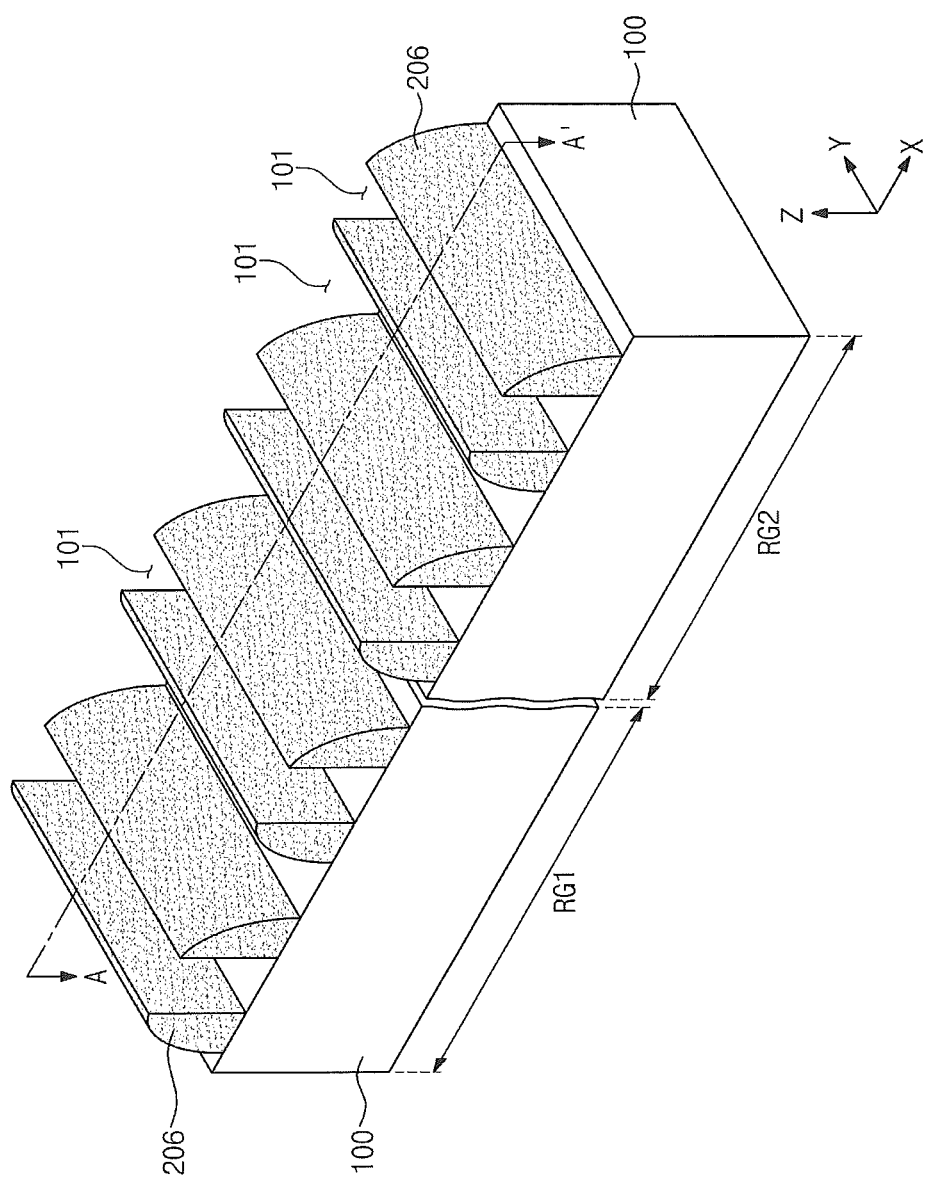
Figure 30:
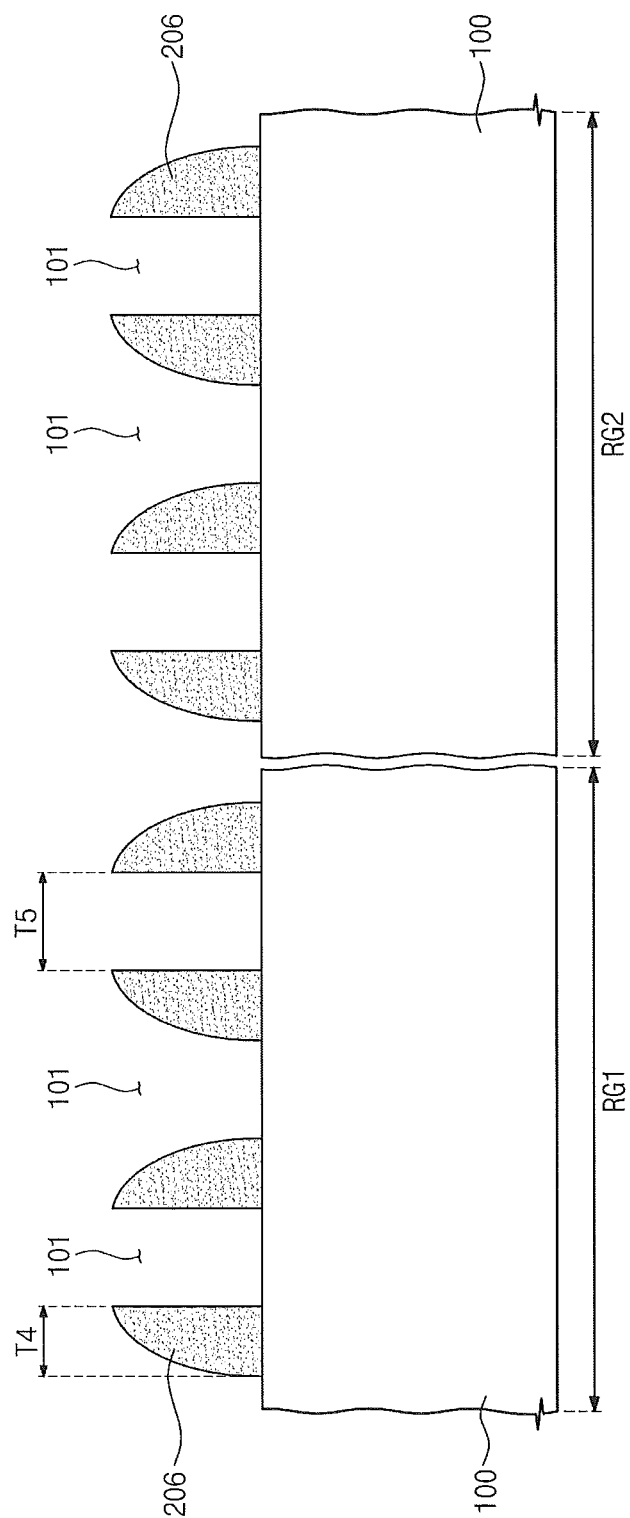

Referring to FIGS. 29 and 30, second mask patterns 206 may be formed on the substrate 100. The second mask patterns 206 may be formed by the process described with reference to FIGS. 1 through 4 to have the spacer shape. The second mask patterns 206 may be spaced apart from each other by the first trenches 101. The fourth width T4 of the second mask pattern 206 may be different from the lower width T5 of the first trench 101. Hereinafter, the width of a trench may refer to a lower width of the trench, and the width of a mask pattern may refer to a lower width of the mask pattern. In example embodiments, the width T5 of the first trench 101 may be greater than the fourth width T4 of the second mask pattern 206.

Figure 31:
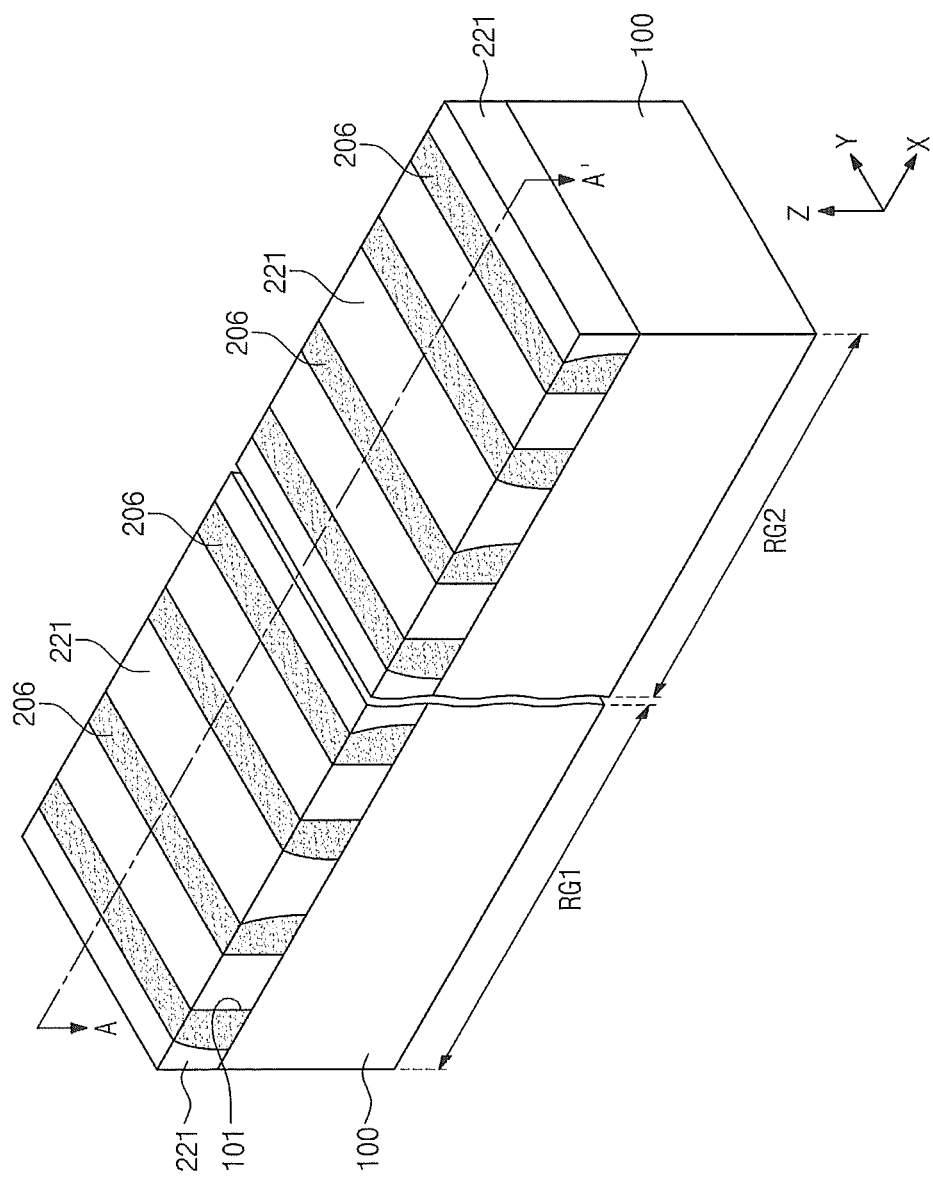
Figure 32:
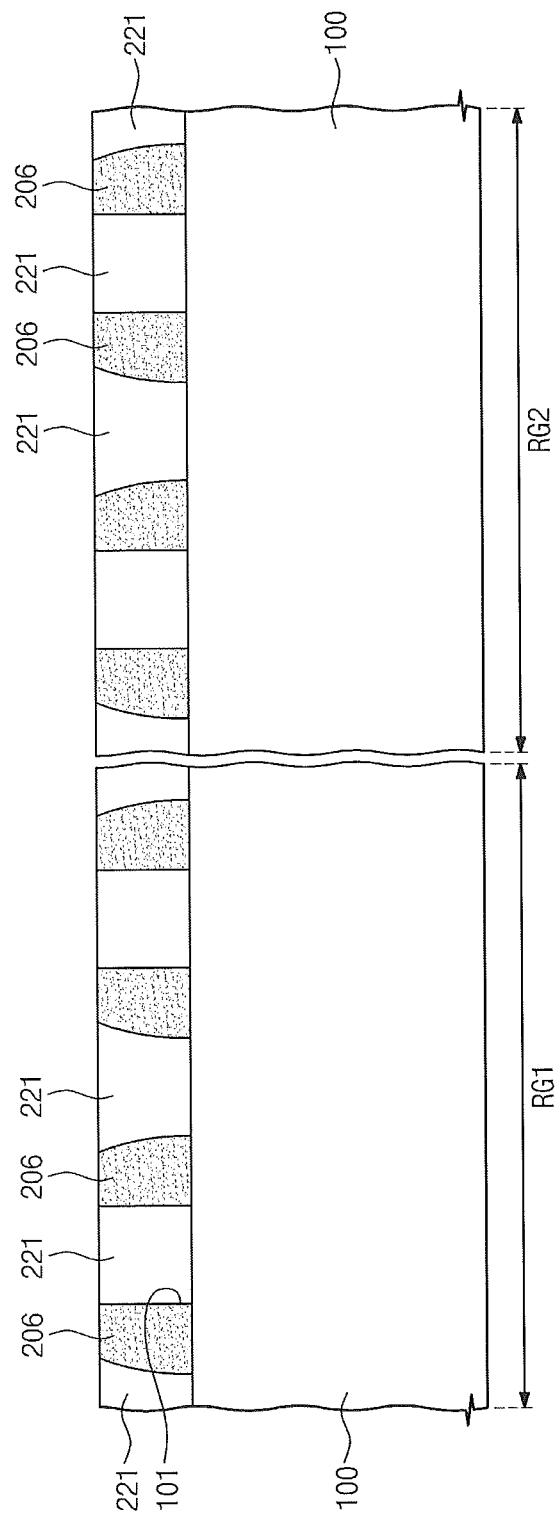

Referring to FIGS. 31 and 32, fifth mask patterns 221 may be formed to fill the first trenches 101. The formation of the fifth mask patterns 221 may include forming a dielectric layer to cover the second mask patterns 206 and performing a planarization process to expose the second mask patterns 206. As the result of the planarization process, upper portions of the second mask patterns 206 may be etched.

Figure 33:
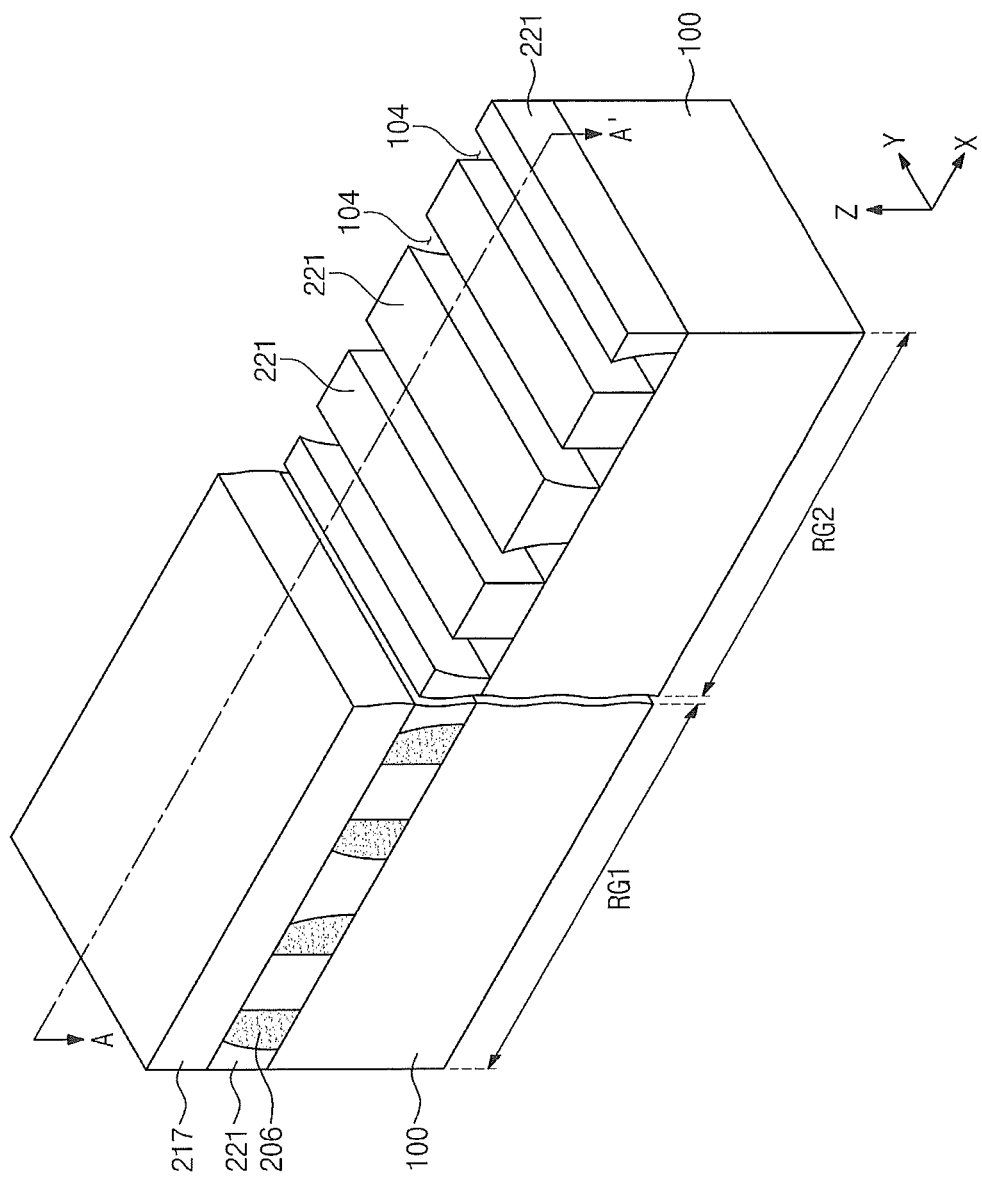
Figure 34:
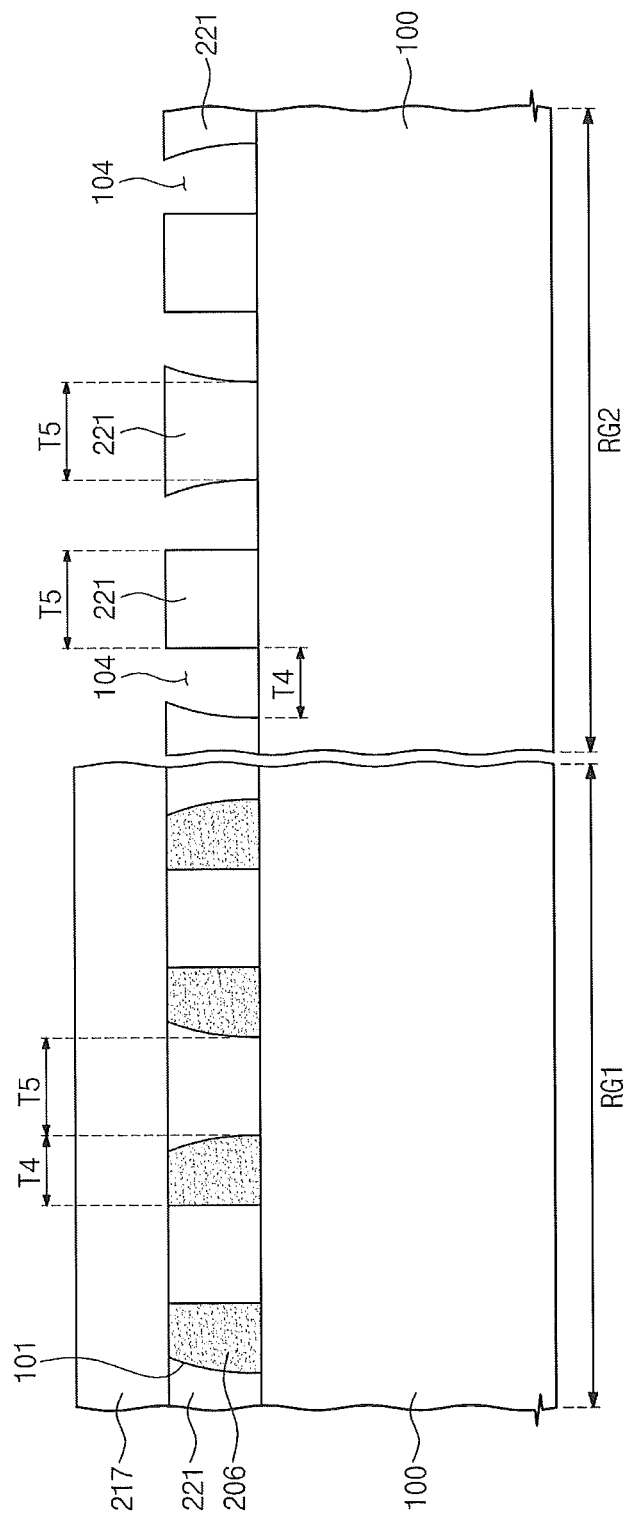

Referring to FIGS. 33 and 34, a sixth mask pattern 217 may be formed to cover the first region RG1 and expose the second region RG2. The sixth mask pattern 217 may be formed of a material having etch selectivity with respect to the fifth mask patterns 221. Some of the second mask patterns 206 exposed by the sixth mask pattern 217 may be selectively removed from the second region RG2. Accordingly, the fifth mask patterns 221 spaced apart from each other by third trenches 104 may remain on the second region RG2. The fifth width T5 of the fifth mask pattern 221 may be substantially equal to the width of the first trench 101. The fourth width T4 of the second mask pattern 206 may be substantially equal to the width of the third trench 104.

Figure 35:
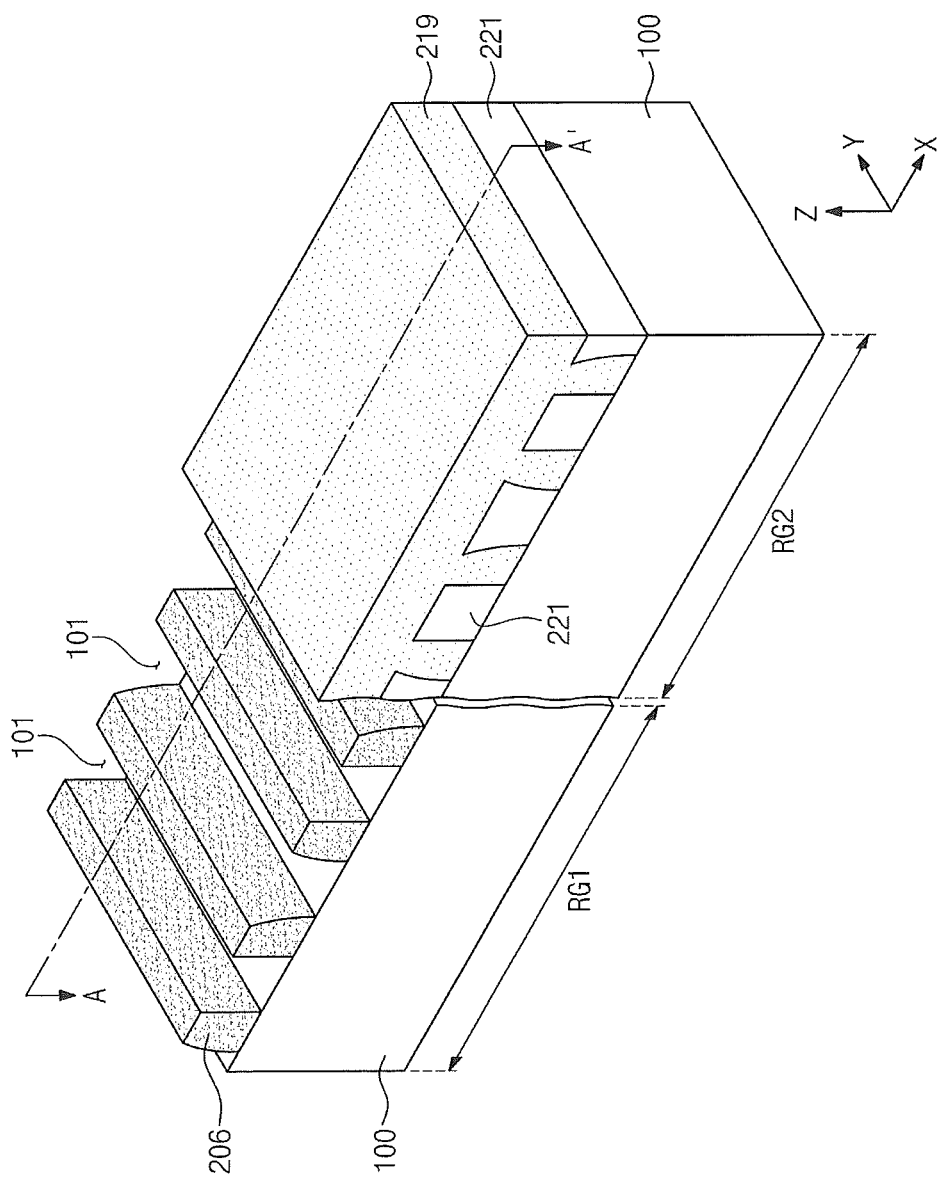
Figure 36:
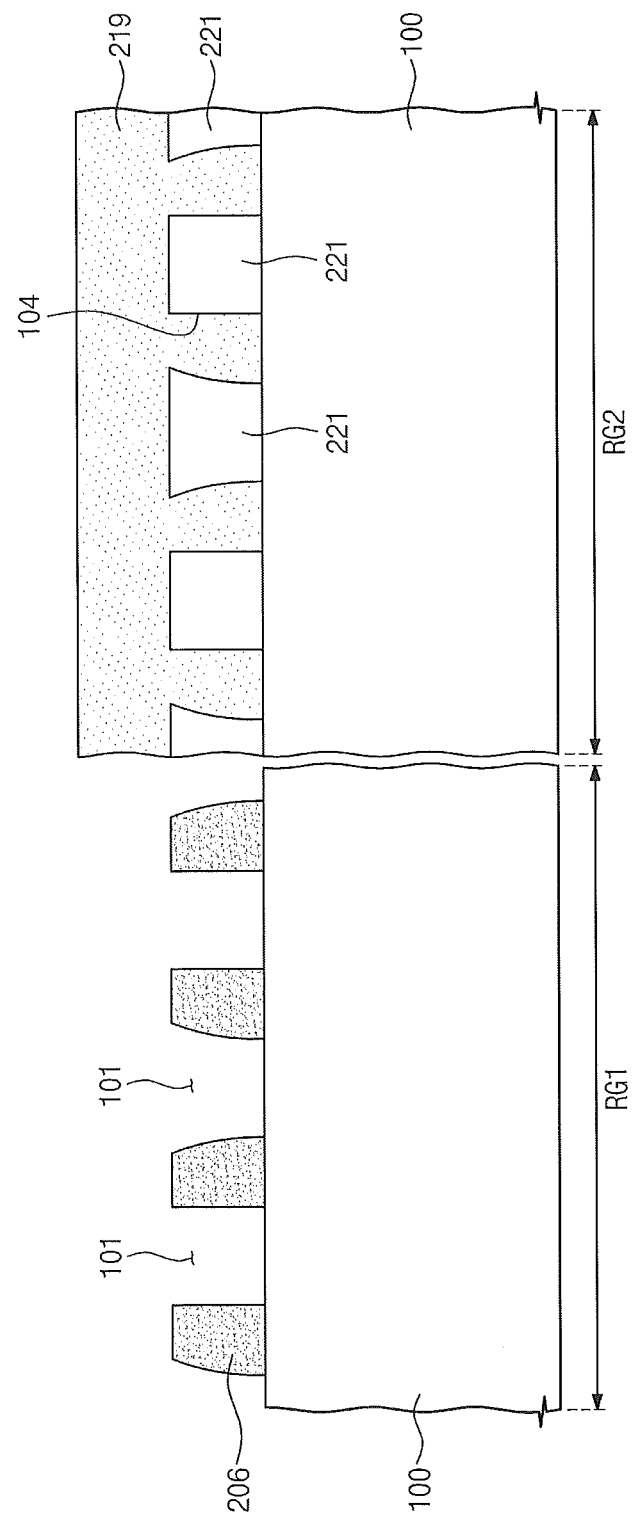

Referring to FIGS. 35 and 36, a seventh mask pattern 219 may be formed to cover the second region RG2 and expose the first region RG1. The seventh mask pattern 219 may fill the third trenches 104. The sixth mask pattern 217 and some of the fifth mask patterns 221 may be selectively removed from the first region RG1 exposed by the seventh mask pattern 219, and the second mask patterns 206 may remain on the first region RG1. As the result of the removal process, the second mask patterns 206 may be spaced apart from each other by the first trenches 101 exposing the substrate 100.

Figure 37:
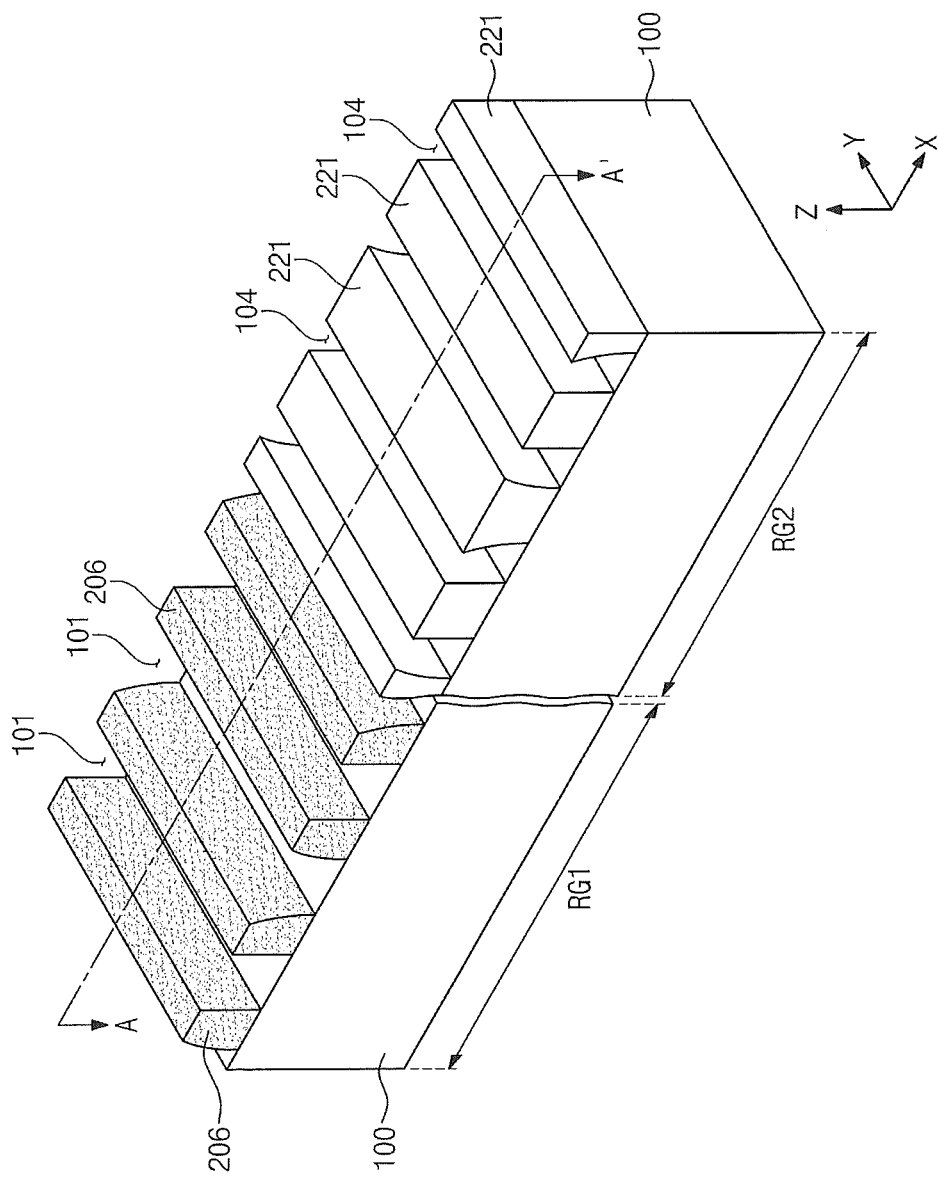
Figure 38:
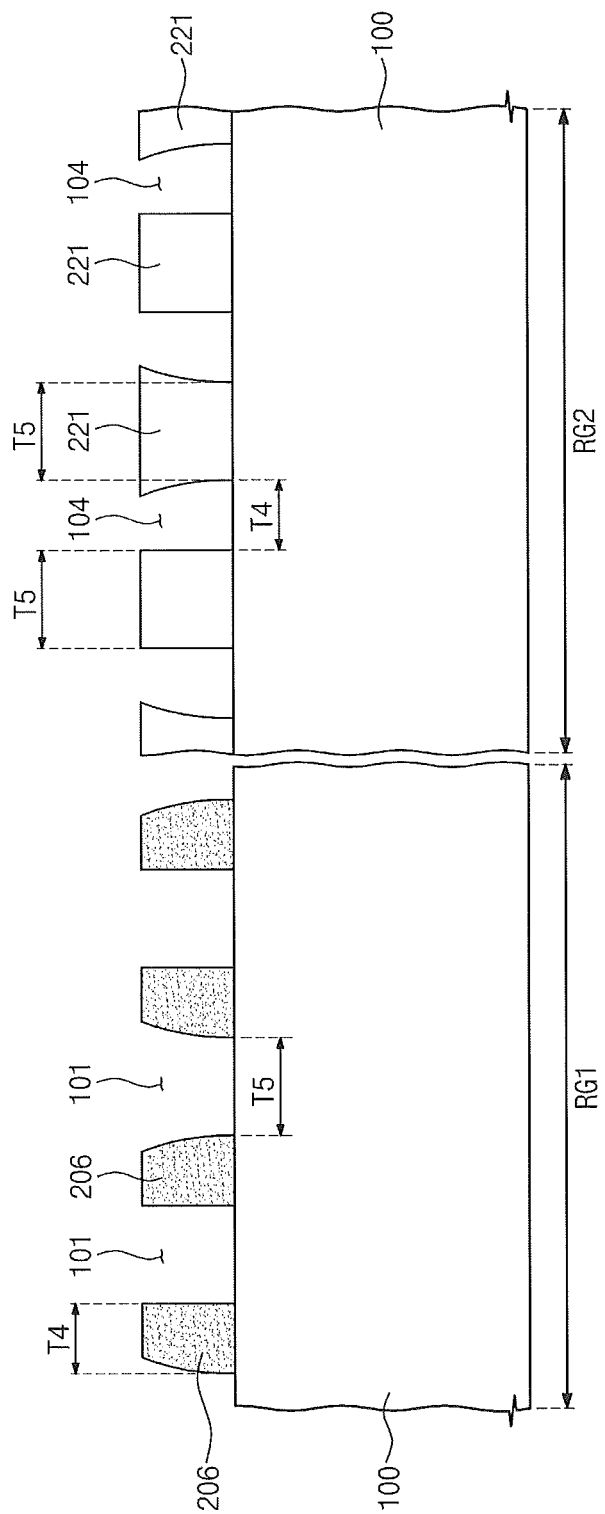

Referring to FIGS. 37 and 38, the seventh mask pattern 219 may be removed from the second region RG2 to expose the fifth mask patterns 221. The substrate 100 between the fifth mask patterns 221 may be exposed by the third trenches 104. The removal of the seventh mask pattern 219 may include a selective etching process. As the result of the removal of the seventh mask pattern 219, the fifth mask patterns 221 may remain on the second region RG2, and the second mask patterns 206 may remain on the first region RG1. The fourth width T4 of the second mask pattern 206 may be different from the fifth width T5 of the fifth mask pattern 221. The fourth width T4 of the second mask pattern 206 may be substantially equal to the width of the third trench 104, and the fifth width T5 of the fifth mask pattern 221 may be substantially equal to the width of the first trench 101.

Figure 39:
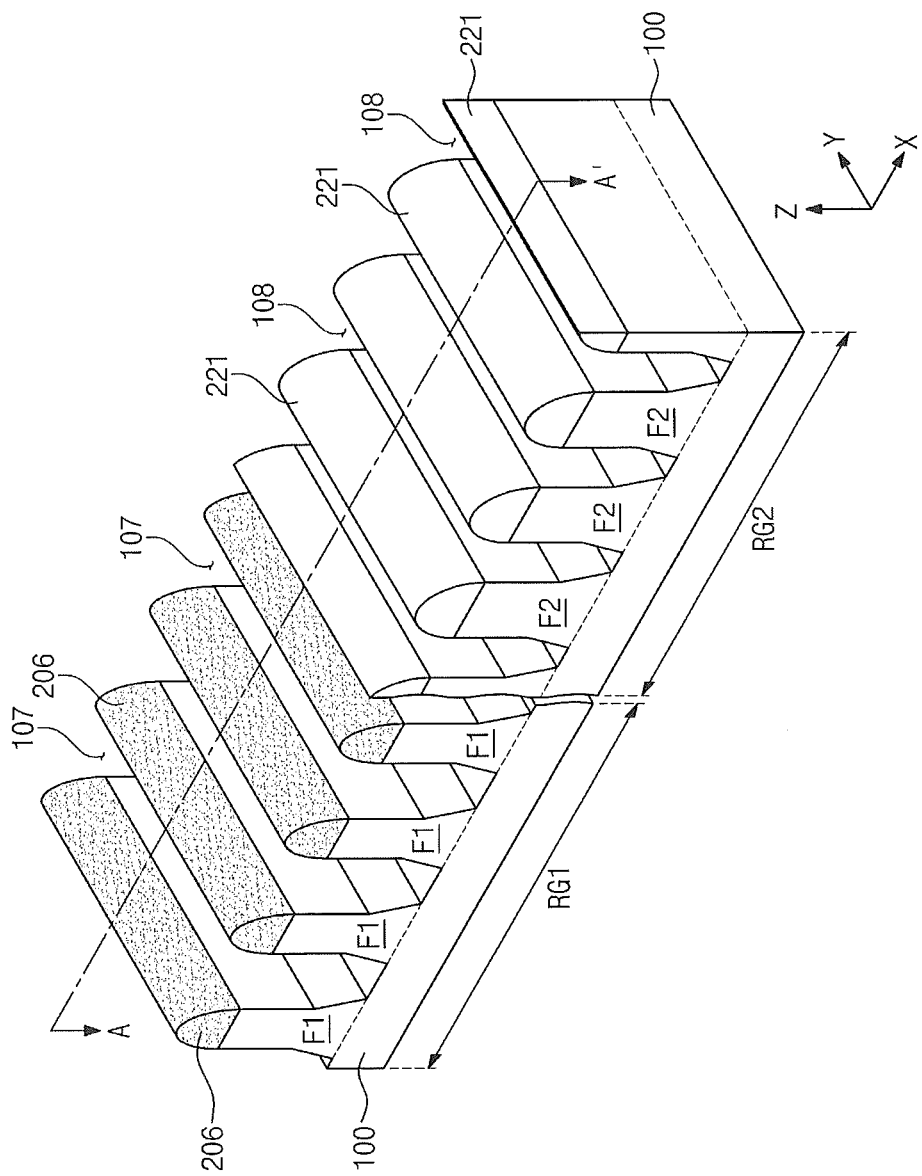
Figure 40:
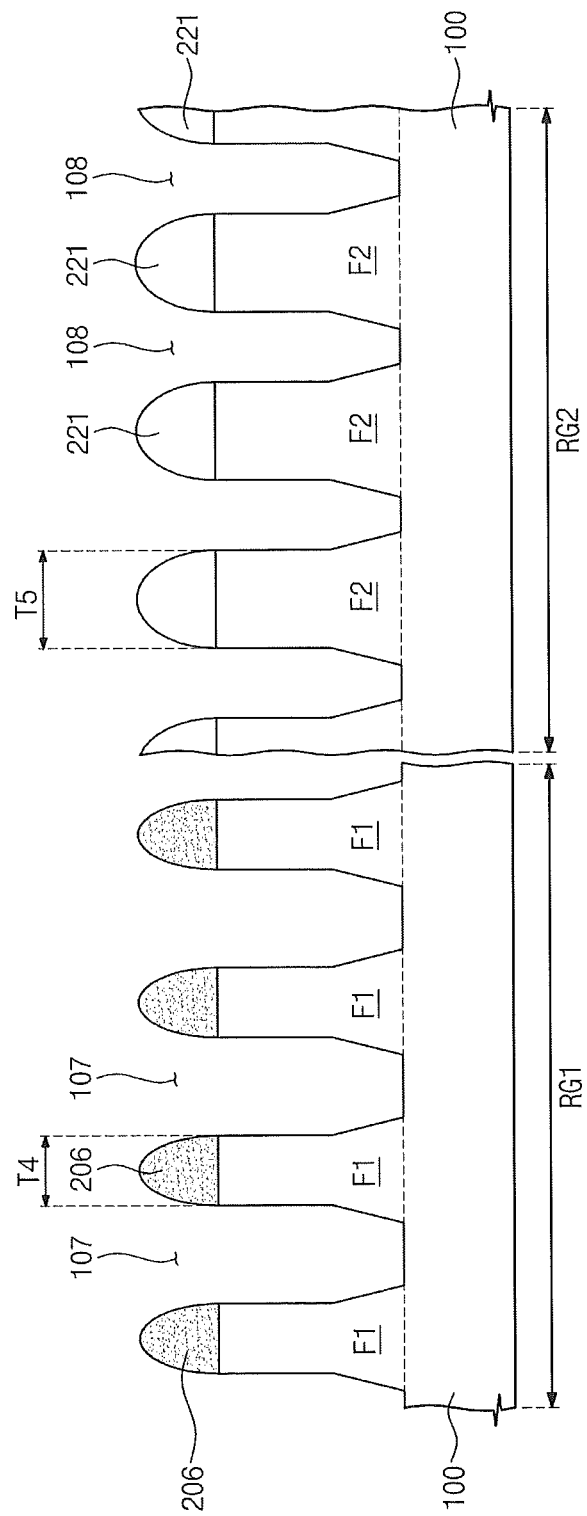

Referring to FIGS. 39 and 40, the substrate 100 may be etched using the second and fifth mask patterns 206 and 221 as an etch mask. As the result of the etching process, the first fin portions F1 may be formed on the first region RG1 to have the fourth width T4, and the second fin portions F2 may be formed on the second region RG2 to have the fifth width T5.

The first fin portions F1 may be spaced apart from each other by fourth trenches 107, and the second fin portions F2 may be spaced apart from each other by fifth trenches 108. Upper portions of the second and fifth mask patterns 206 and 221 may be etched by the etching process to have a rounded profile.

Figure 41:
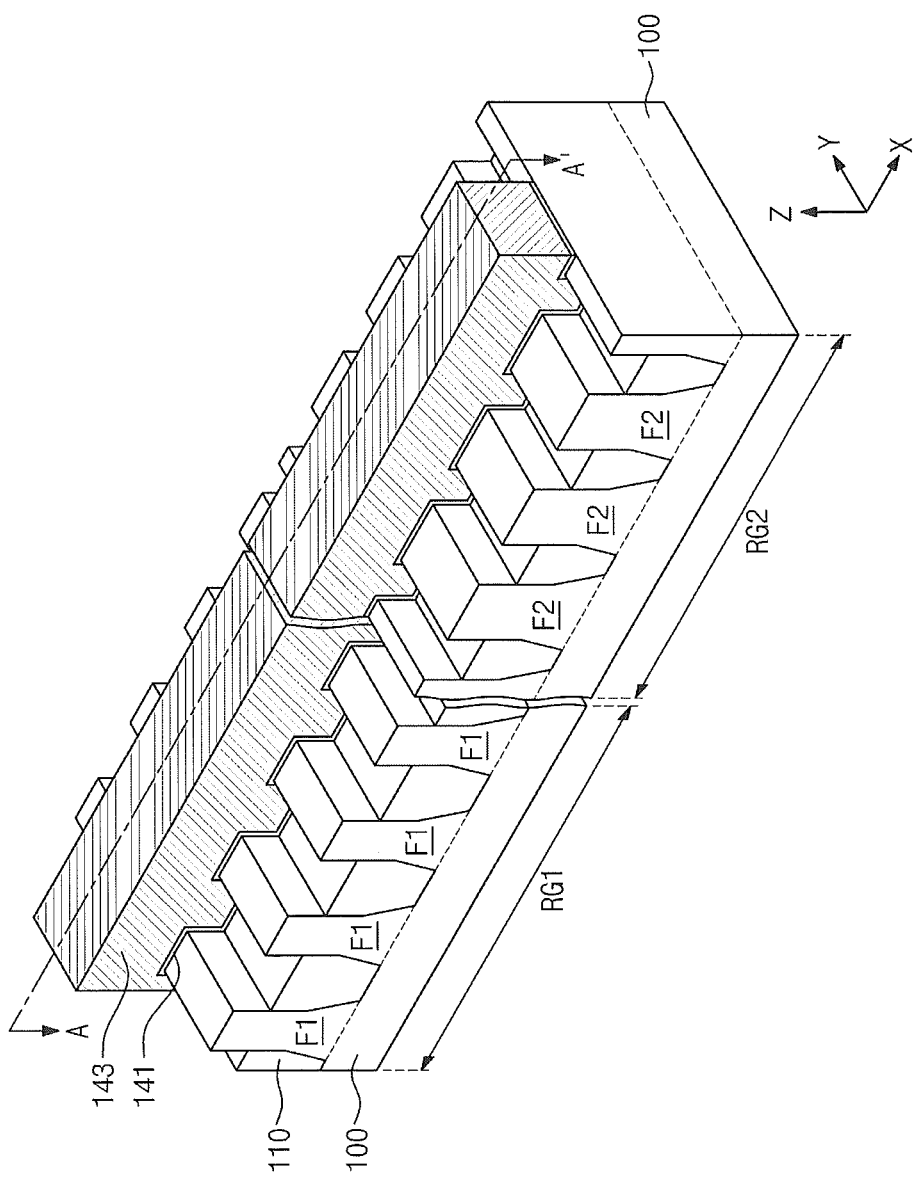
Figure 42:
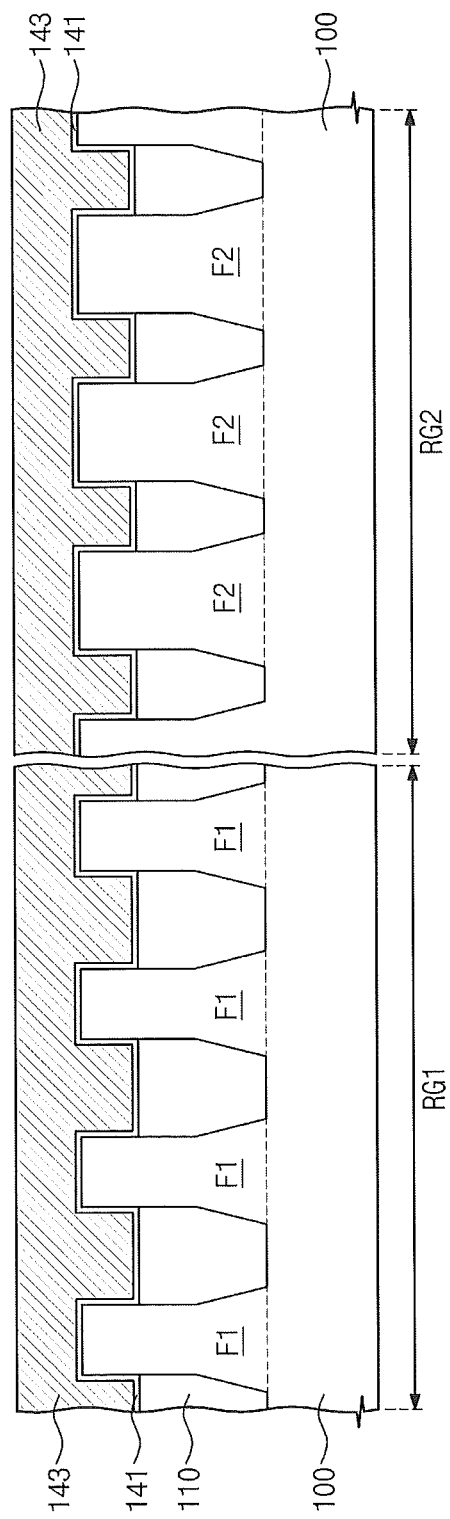

Referring to FIGS. 41 and 42, the second mask patterns 206 and the fifth mask patterns 221 may be removed. After the removal process, the device isolation layers 110 may be formed to fill the fourth and fifth trenches 107 and 108 and expose upper portions of the first and second fin portions F1 and F2. The gate dielectric pattern 141 and the gate electrode pattern 143 may be sequentially formed on the first and second fin portions F1 and F2. The gate dielectric pattern 141 and the gate electrode pattern 143 may be formed using a same or similar process as that described with reference to FIGS. 11 and 12.

Figure 43:
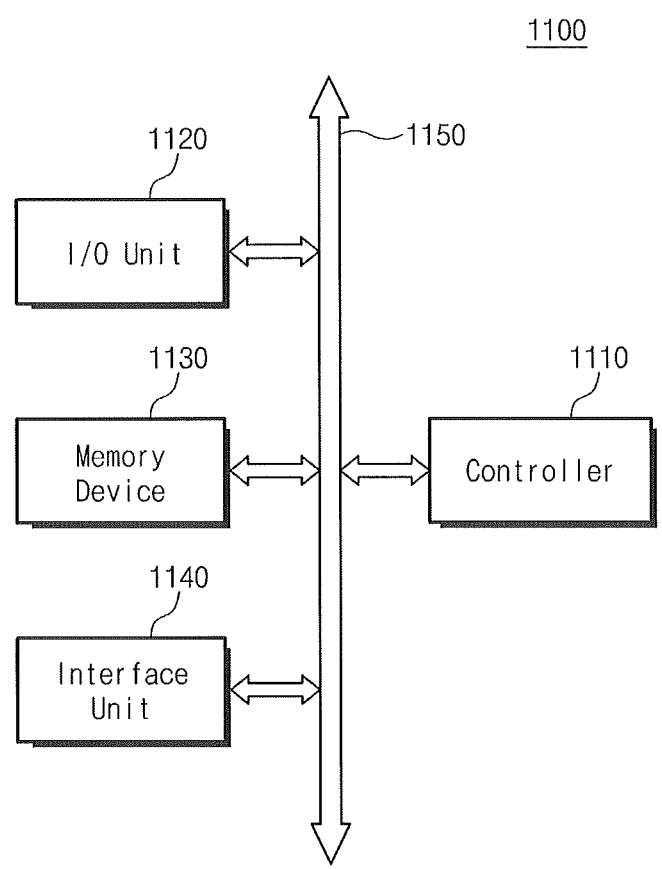

FIG. 43 is a block diagram illustrating an electronic system including a field effect transistor according to example embodiments of the inventive concept.

Referring to FIG. 43, an electronic system 1100 according to example embodiments of the inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device that may have a similar function to any one of the microprocessor, the digital signal processor and the microcontroller. The I/O unit 1120 may include a keypad, a keyboard or a display unit. The memory device 1130 may store data and/or commands. The memory device 1130 may further include another type of data storing devices, which are different from the data storing devices described above. The interface unit 1140 may transmit electrical data to a communication network or may receive electrical data from a communication network. The interface unit 1140 may operate wirelessly or by wire/cable. For example, the interface unit 1140 may include an antenna for wireless communication or a transceiver for cable communication. Although not shown in the drawings, the electronic system 1100 may further include a fast DRAM device and/or a fast SRAM device that acts as a cache memory for improving an operation of the controller 1110. The field effect transistors according to example embodiments of the inventive concept may be provided in the memory device 1130, the controller 1110, and/or the I/O unit 1120. The electronic system 1100 may be applied to a personal digital assistant (PDA), a portable computer, a web tablet, a wireless phone, a mobile phone, a digital music player, a memory card or an electronic product. The electronic product may receive or transmit information/data wirelessly.

According to example embodiments of the inventive concept, provided are methods for enabling fin portions of field effect transistors to have different widths from each other.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating an integrated circuit device, the method comprising:

forming fin-shaped transistor channel regions having respective widths that are the same and protruding from coplanar first and second regions of a substrate surface; and after forming the fin-shaped transistor channel regions having the respective widths that are the same, selectively altering the respective widths of ones of the fin-shaped transistor channel regions protruding from the first region while maintaining the respective widths of ones of the fin-shaped transistor channel regions protruding from the second region, wherein, after selectively altering the respective widths, the respective widths of the ones of the fin-shaped transistor channel regions protruding from the first region are different than the respective widths of the ones of the fin-shaped transistor channel regions protruding from the second region.

2. The method of claim 1, wherein, after forming the fin-shaped transistor channel regions having the respective widths that are the same, selectively altering comprises one of etching sidewalls of the ones of the fin-shaped transistor channel regions protruding from the first region or growing a semiconductor layer of a same conductivity type on the sidewalls such that, after selectively altering the respective widths, the ones of the fin-shaped transistor channel regions protruding from the second region define different transistor threshold voltages than the ones of the fin-shaped transistor channel regions protruding from the first region.

3. The method of claim 2, wherein, after selectively altering the respective widths of the ones of the fin-shaped transistor channel regions protruding from the first region, respective heights of the ones of the fin-shaped transistor channel regions protruding from the first and second regions are substantially similar.

4. The method of claim 2, wherein, after selectively altering the respective widths of the ones of the fin-shaped transistor channel regions protruding from the first region, the first and second regions of the substrate surface are non-coplanar.

5. The method of claim 2, further comprising:

doping the substrate prior to selectively altering the respective widths of the ones of the first fin-shaped transistor channel regions, wherein, after selectively altering the respective widths of the ones of the fin-shaped transistor channel regions protruding from the first region, the ones of the fin-shaped transistor channel regions protruding from the first region have different doping concentrations or doping amounts than the ones of the fin-shaped transistor channel regions protruding from the second region.

6. A method of forming field effect transistors, comprising:

forming fin portions having widths that are the same on first and second regions of a substrate, each of the fin portions protruding from the substrate;

after forming the fin portions, forming a first mask pattern to expose the fin portions on the first region and cover the fin portions on the second region; and after forming the first mask pattern, changing the widths of the fin portions provided on the first region without changing the widths of the fin portions provided on the second region such that the fin portions provided on the first region define different transistor threshold voltages than the fin portions provided on the second region.

7. The method of claim 6, wherein changing the widths of the fin portions comprises growing a semiconductor layer of a same conductivity type on the fin portions.

8. The method of claim 6, further comprising forming device isolation layers on lower sidewalls of the fin portions such that upper sidewalls of the fin portions are free of the device isolation layers,
wherein the semiconductor layer is formed before forming the device isolation layers.

9. The method of claim 8, wherein the forming of the fin portions comprises:
forming second mask patterns on the substrate; and
etching the substrate using the second mask patterns as an etch mask,
wherein the semiconductor layer is formed on sidewalls of the fin portions and on a top surface of the substrate exposed by the first and second mask patterns.

10. The method of claim 7, further comprising forming device isolation layers on lower sidewalls of the fin portions such that upper sidewalls of the fin portions are free of the device isolation layers,
wherein the first mask pattern and the semiconductor layer are formed after forming the device isolation layers.

11. The method of claim 10, wherein the semiconductor layer is formed on upper sidewalls and top surfaces of the fin portions exposed by the device isolation layers and the first mask pattern.

12. The method of claim 7, wherein the semiconductor layer comprises a material having a different lattice constant and/or bandgap from the fin portions.

13. The method of claim 6, wherein changing the widths of the fin portions comprises etching sidewalls of the fin portions provided on the first region, wherein the fin portions comprise part of the substrate.

14. The method of claim 13, further comprising forming device isolation layers on lower sidewalls of the fin portions such that upper sidewalls of the fin portions are free of the device isolation layers,
wherein the device isolation layers are formed after etching the fin portions.

15. The method of claim 14, wherein the forming the fin portions comprises:
forming second mask patterns on the substrate; and
etching the substrate using the second mask patterns as an etch mask,
wherein etching the fin portions comprises etching sidewalls of the fin portions and a top surface of the substrate exposed by the first and second mask patterns.

16. The method of claim 13, further comprising forming device isolation layers on lower sidewalls of the fin portions,
wherein the device isolation layers are formed before etching the fin portions, and wherein etching the fin portions comprises etching top surfaces and upper sidewalls of the fin portions exposed by the first mask pattern and the device isolation layers.

17. The method of claim 6, wherein forming the fin portions comprises:
forming second mask patterns on the substrate; and
etching the substrate using the second mask patterns as an etch mask,
wherein forming the second mask patterns comprises:
forming third mask patterns on the substrate;
performing a spacer-forming process to farm the second mask patterns on sidewalls of the third mask patterns; and
removing the third mask patterns.

18. The method of claim 17, wherein respective widths of the second mask patterns are substantially equal.

19. A method of fabricating an integrated circuit device, the method comprising:
forming fin-shaped transistor channel regions having respective widths that are the same protruding from coplanar first and second regions of a substrate surface; and
after forming the fin-shaped transistor channel regions having the respective widths that are the same, selectively altering the respective widths of ones of the fin-shaped transistor channel regions protruding from the first region while maintaining the respective widths of ones of the fin-shaped transistor channel regions protruding from the second region by etching sidewalls of the ones of the fin-shaped transistor channel regions protruding from the first region or growing a semiconductor layer of a same conductivity type on the sidewalls such that the ones of the fin-shaped transistor channel regions protruding from the first region have different doping concentrations or doping amounts that define different transistor threshold voltages than the ones of the fin-shaped transistor channel regions protruding from the second region,
wherein, after selectively altering the respective widths of the ones of the fin-shaped transistor channel regions protruding from the first region, the respective widths of the ones of the fin-shaped transistor channel regions protruding from the first region are different than the respective widths of the ones of the fin-shaped transistor channel regions protruding from the second region, and respective heights of the ones of the fin-shaped transistor channel regions protruding from the first and second regions are substantially similar.

* * * * *